United States Patent
Wu et al.

(10) Patent No.: US 9,893,800 B2
(45) Date of Patent: Feb. 13, 2018

(54) METHOD AND APPARATUS FOR SPECTRAL EFFICIENT DATA TRANSMISSION IN SATELLITE SYSTEMS

(71) Applicant: QUALCOMM Incorporated, San Diego, CA (US)

(72) Inventors: Qiang Wu, San Diego, CA (US); Peter John Black, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 47 days.

(21) Appl. No.: 14/865,590

(22) Filed: Sep. 25, 2015

(65) Prior Publication Data
US 2016/0277096 A1 Sep. 22, 2016

Related U.S. Application Data

(60) Provisional application No. 62/136,224, filed on Mar. 20, 2015, provisional application No. 62/196,277, filed on Jul. 23, 2015.

(51) Int. Cl.
*H04B 7/185* (2006.01)
*H04L 5/00* (2006.01)
(Continued)

(52) U.S. Cl.
CPC ........ *H04B 7/18582* (2013.01); *H03M 13/09* (2013.01); *H03M 13/258* (2013.01);
(Continued)

(58) Field of Classification Search
CPC ... H04L 1/0041; H04L 1/0064; H04L 1/0058; H04B 7/18513; H04B 7/18523;
(Continued)

(56) References Cited

U.S. PATENT DOCUMENTS

| 7,630,682 B2 | 12/2009 | Monte et al. |
| 8,170,474 B2 | 5/2012 | Karabinis et al. |

(Continued)

FOREIGN PATENT DOCUMENTS

| EP | 0054118 A1 | 6/1982 |
| EP | 1605598 A1 | 12/2005 |

(Continued)

OTHER PUBLICATIONS

ITU-R Radio communication sector of ITU, Detailed specifications of the satellite radio interfaces of international mobile telecommunications-advanced, Dec. 2013, International telecommunication union, pp. 1 to 83 (retrieved from google.come May 29, 2017).*

(Continued)

*Primary Examiner* — Shelly A Chase
(74) *Attorney, Agent, or Firm* — Muncy, Geissler, Olds & Lowe, PC

(57) ABSTRACT

A communication satellite system provides for spectral efficient data transmissions by a gateway to multiple user terminals by way of a satellite. The gateway transmits multiple blocks in a single slot, each block intended for one of the user terminals, where each block is encoded and modulated according to a scheme that may be different for each intended user terminal. Upon re-transmission of a block if that block is lost or received in error, the block may be encoded and modulated according to another scheme that is less spectrally efficient than in the first transmission of the block.

52 Claims, 17 Drawing Sheets

(51) Int. Cl.
| | |
|---|---|
| *H04W 72/04* | (2009.01) |
| *H03M 13/25* | (2006.01) |
| *H03M 13/29* | (2006.01) |
| *H03M 13/09* | (2006.01) |
| *H04L 1/00* | (2006.01) |

(52) U.S. Cl.
CPC ...... *H03M 13/2906* (2013.01); *H04B 7/1858* (2013.01); *H04B 7/18517* (2013.01); *H04B 7/18519* (2013.01); *H04L 1/00* (2013.01); *H04L 1/0041* (2013.01); *H04L 1/0058* (2013.01); *H04L 1/0064* (2013.01); *H04L 5/0055* (2013.01); *H04W 72/0446* (2013.01)

(58) Field of Classification Search
CPC .............. H04B 7/1858; H04B 7/18519; H04B 7/18517; H04B 7/18582; H03M 13/09; H03M 13/258; H03M 13/2957; H03M 13/2906
See application file for complete search history.

(56) References Cited

U.S. PATENT DOCUMENTS

| | | | |
|---|---|---|---|
| 8,514,820 | B2 | 8/2013 | Cai et al. |
| 8,660,481 | B2 * | 2/2014 | Miller ................ H04B 7/18523 370/316 |
| 8,797,966 | B2 | 8/2014 | Dinan |
| 2006/0023717 | A1 | 2/2006 | Trachtman et al. |
| 2007/0097852 | A1 | 5/2007 | Thesling |
| 2012/0147939 | A1 | 6/2012 | Han et al. |
| 2013/0019144 | A1 | 1/2013 | Harata et al. |
| 2013/0114442 | A1 | 5/2013 | Park et al. |
| 2014/0056335 | A1 | 2/2014 | Ryu et al. |
| 2016/0056868 | A1* | 2/2016 | Adachi ............. H04W 52/0206 370/329 |

FOREIGN PATENT DOCUMENTS

| | | |
|---|---|---|
| EP | 2293453 A1 | 3/2011 |
| WO | 03104919 A2 | 12/2003 |

OTHER PUBLICATIONS

International Search Report and Written Opinion—PCT/US2016/022176—ISA/EPO—Sep. 13, 2016.

Kasahara Y., et al., "Performance of Point-to-Multipoint Communication Systems over Nonstationary Satellite-Terrestrial Links", Electronics and Communication in Japan, Part 1, XP000912329, Jun. 1, 2000, vol. 83, No. 6, pp. 21-30.

Partial International Search Report—PCT/US2016/022176—ISA/EPO—Jun. 24, 2016.

* cited by examiner

METHOD AND APPARATUS FOR SPECTRAL EFFICIENT DATA TRANSMISSION IN SATELLITE SYSTEMS

CROSS-REFERENCE TO RELATED APPLICATION

The present application for patent claims the benefit of U.S. Provisional Application No. 62/136,224, filed Mar. 20, 2015, and U.S. Provisional Application No. 62/196,277, filed Jul. 23, 2015, both entitled "METHOD AND APPARATUS FOR SPECTRAL EFFICIENT DATA TRANSMISSION IN SATELLITE SYSTEMS," and both assigned to the assignee hereof and expressly incorporated herein by reference in its entirety.

INTRODUCTION

Various aspects described herein relate to satellite communications, and more particularly, to spectral efficient data transmission for multiple user terminals to a satellite.

Conventional satellite-based communication systems include gateways and one or more satellites to relay communication signals between the gateways and one or more user terminals. A gateway is an earth station having an antenna for transmitting signals to, and receiving signals from, communication satellites. A gateway provides communication links, using satellites, for connecting a user terminal to other user terminals or users of other communication systems, such as a public switched telephone network, the Internet, and various public and/or private networks. A satellite is an orbiting receiver and repeater used to relay information.

A satellite can receive signals from and transmit signals to a user terminal provided the user terminal is within the footprint of the satellite. The footprint of a satellite is the geographic region on the surface of the Earth within the range of signals of the satellite. The footprint is usually geographically divided into beams, through the use of beamforming antennas. Each beam covers a particular geographic region within the footprint. Beams may be directed so that more than one beam from the same satellite covers the same specific geographic region.

Geosynchronous satellites have long been used for communications. A geosynchronous satellite is stationary relative to a given location on the Earth, and thus there is little timing shift and Doppler frequency shift in radio signal propagation between a communication transceiver on the Earth and the geosynchronous satellite. However, because geosynchronous satellites are limited to a geosynchronous orbit (GSO), which is a circle having a radius of approximately 42,164 km from the center of the Earth directly above the Earth's equator, the number of satellites that may be placed in the GSO is limited. As alternatives to geosynchronous satellites, communication systems that utilize a constellation of satellites in non-geosynchronous orbits, such as low-earth orbits (LEO), have been devised to provide communication coverage to the entire Earth or at least large parts of the Earth.

Compared to GSO satellite-based and terrestrial communication systems, non-geosynchronous satellite-based systems, such as LEO satellite-based systems, may present several challenges. In many instances the communication environment is non-stationary, where the satellites providing communication to the user terminals, as well as the user terminals themselves, are in motion. As a result, there will be Doppler shifts, time delays, and changing communication channel characteristics, all presenting a number of challenges to robust and reliable communications.

SUMMARY

Aspects of the claimed subject matter are directed to systems and methods for spectral efficient data transmission in satellite systems.

As an example, a method comprises: receiving, at a gateway, channel state information from a plurality of user terminals via a satellite; encoding by the gateway a plurality of blocks into a plurality of encoded blocks, each block for a corresponding user terminal, wherein the gateway encodes each block according to the value of the channel state information of its corresponding user terminal; modulating by the gateway the plurality of encoded blocks into a plurality of modulated and encoded blocks, wherein the gateway modulates each encoded block according to the value of the channel state information of its corresponding user terminal; and transmitting by the gateway to the plurality of user terminals via the satellite a slot comprising the plurality of modulated and encoded blocks.

As an example, a gateway comprises: a modem; and at least one processor in communication with the modem, the at least one processor and the modem configured, in combination, to: demodulate channel state information from a plurality of user terminals via a satellite; encode a plurality of blocks into a plurality of encoded blocks, each block for a corresponding user terminal, wherein each block is encoded according to the value of the channel state information of its corresponding user terminal; modulate the plurality of encoded blocks into a plurality of modulated and encoded blocks, wherein each encoded block is modulated according to the value of the channel state information of its corresponding user terminal; and cause the gateway to transmit the plurality of user terminals via the satellite a slot comprising the plurality of modulated and encoded blocks.

As an example, a non-transitory computer-readable media has stored instructions that, when executed by at least one processor in a gateway, cause the gateway to perform a method comprising: receiving channel state information from a plurality of user terminals via a satellite; encoding a plurality of blocks into a plurality of encoded blocks, each block for a corresponding user terminal, wherein each block is encoded according to the value of the channel state information of its corresponding user terminal; modulating the plurality of encoded blocks into a plurality of modulated and encoded blocks, wherein each encoded block is modulated according to the value of the channel state information of its corresponding user terminal; and transmitting to the plurality of user terminals via the satellite a slot comprising the plurality of modulated and encoded blocks.

As an example, a gateway comprises: means for receiving, at the gateway, channel state information from a plurality of user terminals via a satellite; means for encoding by the gateway a plurality of blocks into a plurality of encoded blocks, each block for a corresponding user terminal, wherein the gateway encodes each block according to the value of the channel state information of its corresponding user terminal; means for modulating by the gateway the plurality of encoded blocks into a plurality of modulated and encoded blocks, wherein the gateway modulates each encoded block according to the value of the channel state information of its corresponding user terminal; and means for transmitting by the gateway to the plurality of user terminals via the satellite a slot comprising the plurality of modulated and encoded blocks.

As an example, a method comprises: transmitting a first slot by a gateway to a satellite, the first slot comprising a block where the block occupies a first fraction of the first slot; and transmitting a second slot by the gateway to the satellite upon the gateway receiving a negative acknowledgement for the transmission of the block in the first slot, the second slot comprising the block where the block occupies a second fraction of the second slot, the first and second slots having a same transmission time interval, and the second fraction larger than the first fraction.

As an example, a method of concatenated encoding by a gateway comprises: providing a block check for a block; appending the block check to the block; segmenting the block with appended block check into at least one sub-block; encoding the at least one sub-block with a systematic encoder to provide parity bits; providing a sub-block check for each of the at least one sub-block; appending to each of the at least one sub-block its corresponding sub-block check; turbo encoding each of the at least one sub-block with appended sub-block check to provide at least one coded sub-block; grouping the parity bits into at least one parity block; providing a parity block check for each of the at least one parity block; appending to each of the at least one parity block its corresponding parity block check; and turbo encoding each of the at least one parity block with appended parity block check to provide at least one coded parity block.

As an example, a gateway comprises: a modem; and at least one processor in communication with the modem, the at least one processor and the modem configured, in combination, to: provide a block check for a block; append the block check to the block; segment the block with appended block check into at least one sub-block; encode systematically the at least one sub-block to provide parity bits; provide a sub-block check for each of the at least one sub-block; append to each of the at least one sub-block its corresponding sub-block check; turbo encode each of the at least one sub-block with appended sub-block check to provide at least one coded sub-block; group the parity bits into at least one parity block; provide a parity block check for each of the at least one parity block; append to each of the at least one parity block its corresponding parity block check; and turbo encode each of the at least one parity block with appended parity block check to provide at least one coded parity block.

As an example, a gateway comprises: means for providing a block check for a block; means for appending the block check to the block; means for segmenting the block with appended block check into at least one sub-block; means for encoding the at least one sub-block with a systematic encoder to provide parity bits; means for providing a sub-block check for each of the at least one sub-block; means for appending to each of the at least one sub-block its corresponding sub-block check; means for turbo encoding each of the at least one sub-block with appended sub-block check to provide at least one coded sub-block; means for grouping the parity bits into at least one parity block; means for providing a parity block check for each of the at least one parity block; means for appending to each of the at least one parity block its corresponding parity block check; and means for turbo encoding each of the at least one parity block with appended parity block check to provide at least one coded parity block.

As an example, a non-transitory computer-readable medium has stored instructions that, when executed by at least one processor in a gateway, cause the gateway to perform a method comprising: providing a block check for a block; appending the block check to the block; segmenting the block with appended block check into at least one sub-block; encoding the at least one sub-block with a systematic encoder to provide parity bits; providing a sub-block check for each of the at least one sub-block; appending to each of the at least one sub-block its corresponding sub-block check; turbo encoding each of the at least one sub-block with appended sub-block check to provide at least one coded sub-block; grouping the parity bits into at least one parity block; providing a parity block check for each of the at least one parity block; appending to each of the at least one parity block its corresponding parity block check; and turbo encoding each of the at least one parity block with appended parity block check to provide at least one coded parity block.

As an example, a method of concatenated decoding by a user terminal, the method comprising: turbo decoding a received at least one coded sub-block to provide a first estimate of at least one sub-block; concatenating the first estimate of the at least one sub-block to provide a first estimate of a block with a first estimate of a block check; determining whether the first estimate of the block check passes or fails; and provided the first estimate of the block check fails: turbo decoding a received at least one coded parity block to provide an estimate of at least one parity block; outer decoding the first estimate of the at least one sub-block using the estimate of the at least one parity block to provide a second estimate of the at least one sub-block; concatenating the second estimate of the at least one sub-block to provide a second estimate of the block with a second estimate of the block check; and determining whether the second estimate of the block check passes or fails.

As an example, a user terminal comprises: a modem; and at least one processor in communication with the modem, the at least one processor and the modem configured, in combination, to: turbo decode a received at least one coded sub-block to provide a first estimate of at least one sub-block; concatenate the first estimate of the at least one sub-block to provide a first estimate of a block with a first estimate of a block check; determine whether the first estimate of the block check passes or fails; and provided the first estimate of the block check fails: turbo decode a received at least one coded parity block to provide an estimate of at least one parity block; outer decode the first estimate of the at least one sub-block using the estimate of the at least one parity block to provide a second estimate of the at least one sub-block; concatenate the second estimate of the at least one sub-block to provide a second estimate of the block with a second estimate of the block check; and determine whether the second estimate of the block check passes or fails.

As an example, a user terminal comprises: means for turbo decoding a received at least one coded sub-block to provide a first estimate of at least one sub-block; means for concatenating the first estimate of the at least one sub-block to provide a first estimate of a block with a first estimate of a block check; means for determining whether the first estimate of the block check passes or fails; means for turbo decoding a received at least one coded parity block to provide an estimate of at least one parity block when the first estimate of the block check fails; means for outer decoding the first estimate of the at least one sub-block using the estimate of the at least one parity block to provide a second estimate of the at least one sub-block when the first estimate of the block check fails; means for concatenating the second estimate of the at least one sub-block to provide a second estimate of the block with a second estimate of the block check when the first estimate of the block check fails; and means for determining whether the second estimate of the block check passes or fails when the first estimate of the block check fails.

As an example, a non-transitory computer-readable medium has stored instructions that, when executed by at least one processor in a user terminal, cause the user terminal to perform a method comprising: turbo decoding a received at least one coded sub-block to provide a first estimate of at least one sub-block; concatenating the first estimate of the at least one sub-block to provide a first estimate of a block with a first estimate of a block check; determining whether the first estimate of the block check passes or fails; and provided the first estimate of the block check fails: turbo decoding a received at least one coded parity block to provide an estimate of at least one parity block; outer decoding the first estimate of the at least one sub-block using the estimate of the at least one parity block to provide a second estimate of the at least one sub-block; concatenating the second estimate of the at least one sub-block to provide a second estimate of the block with a second estimate of the block check; and determining whether the second estimate of the block check passes or fails.

DETAILED DESCRIPTION

A communication satellite system provides for spectral efficient data transmissions by a gateway to multiple user terminals by way of a satellite. The gateway transmits multiple blocks in a single slot, each block intended for one of the user terminals, where each block is coded and modulated according to a scheme that may be different for each intended user terminal. Upon re-transmission of a block if that block is lost or received in error, the block may be coded and modulated according to another scheme so as to provide stronger error control correction and where the modulation is of lower order than in the first transmission of the block.

Aspects of the claimed subject matter are disclosed in the following description and related drawings. Alternate systems may be devised without departing from the scope of the claimed subject matter. Additionally, well-known elements will not be described in detail or will be omitted so as not to obscure the relevant details of the description.

The terminology used herein is for the purpose of describing particular aspects of the claimed subject matter only and is not intended to be limiting. As used herein, the singular forms "a," "an," and "the" are intended to include the plural forms as well, unless the context clearly indicates otherwise. It will be further understood that the terms "comprises", "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Further, some aspects of the claimed subject matter are described in terms of sequences of actions to be performed by, for example, elements of a computing device. It will be recognized that various actions described herein can be performed by several entities, such as: specific circuits (e.g., application specific integrated circuits (ASICs)); program instructions being executed by one or more processors; or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the claimed subject matter may be embodied in a number of different forms, all of which have been contemplated to be within the scope of the claimed subject matter. In addition, for each of the aspects of the claimed subject matter described herein, the corresponding form of any such aspect may be described herein as, for example, "logic configured to" perform the described action.

Figure 1:
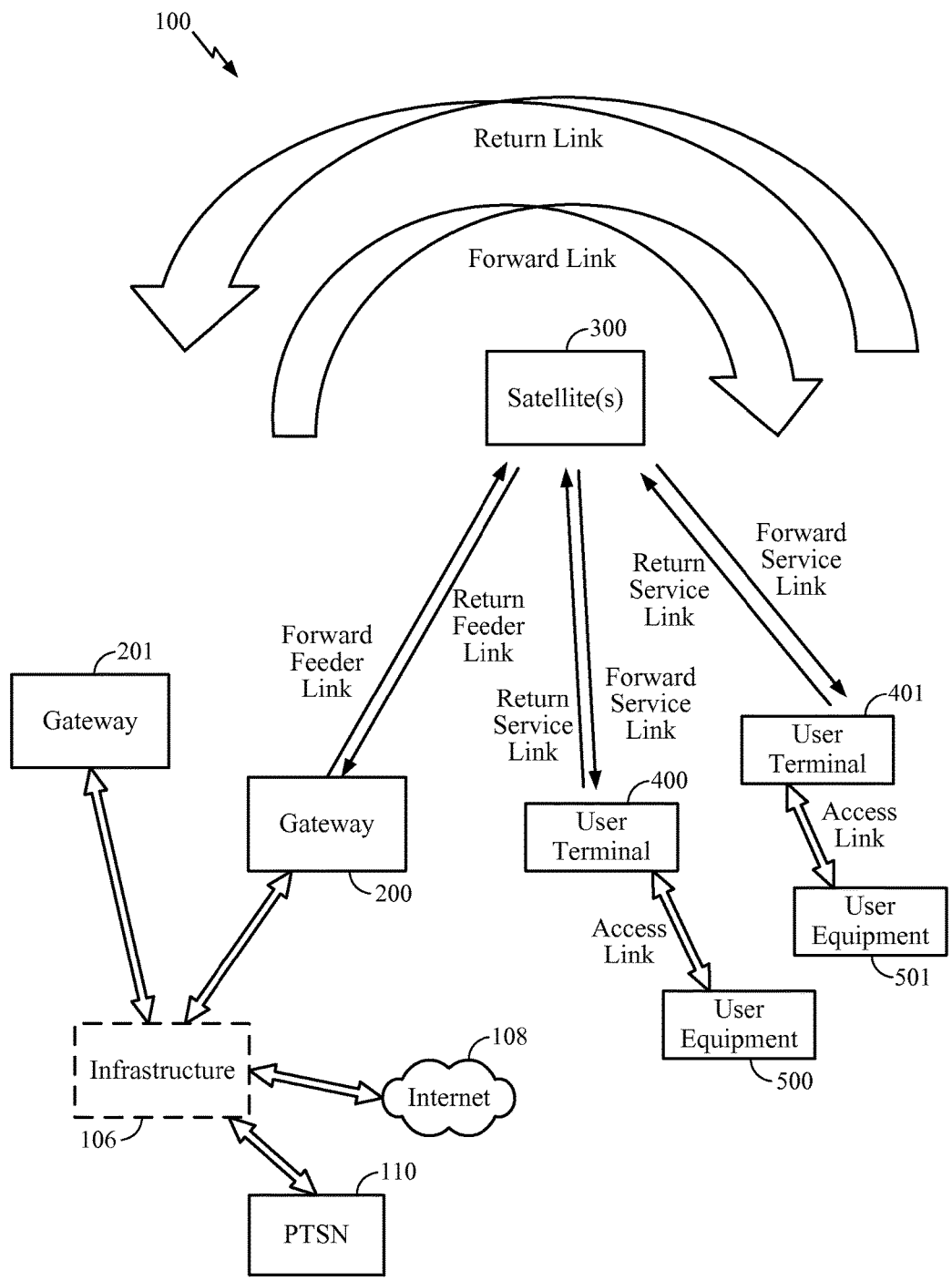
FIG. 1 is a block diagram of an example satellite communication system.

FIG. 1 illustrates an example of a satellite communication system 100 which includes a plurality of satellites (although only one satellite 300 is shown for clarity of illustration) in non-geosynchronous orbits, for example, low-earth orbits (LEO), a gateway 200 in communication with the satellite 300, a plurality of user terminals (UTs) 400 and 401 in communication with the satellite 300, and a plurality of user equipment (UE) 500 and 501 in communication with the UTs 400 and 401, respectively. Each UE 500 or 501 may be a user device such as a mobile device, a telephone, a smartphone, a tablet, a laptop computer, a computer, a wearable device, a smart watch, an audiovisual device, or any device including the capability to communicate with a UT. Additionally, the UE 500 and/or UE 501 may be a device (e.g., access point, small cell, etc.) that is used to communicate to one or more end user devices. In the example illustrated in FIG. 1, the UT 400 and the UE 500 communicate with each other via a bidirectional access link (having a forward access link and return access link), and similarly, the UT 401 and the UE 501 communicate with each other via another bidirectional access link. In another implementation, one or more additional UE (not shown) may be configured to receive only and therefore communicate with a UT only using a forward access link. In another implementation, one or more additional UE (not shown) may also communicate with UT 400 or UT 401. Alternatively, a UT and a corresponding UE may be integral parts of a single physical device, such as a mobile telephone with an integral satellite transceiver and an antenna for communicating directly with a satellite, for example.

The gateway 200 may have access to the Internet 108 or one or more other types of public, semiprivate or private networks. In the example illustrated in FIG. 1, the gateway 200 is in communication with infrastructure 106, which is capable of accessing the Internet 108 or one or more other types of public, semiprivate or private networks. The gateway 200 may also be coupled to various types of communication backhaul, including, for example, landline networks such as optical fiber networks or public switched telephone networks (PSTN) 110. Further, in alternative implementations the gateway 200 may interface to the Internet 108, PSTN 110, or one or more other types of public, semiprivate or private networks without using infrastructure 106. Still further, gateway 200 may communicate with other gateways, such as gateway 201 through the infrastructure 106 or alternatively may be configured to communicate to gateway 201 without using infrastructure 106. Infrastructure 106 may include, in whole or part, a network control center (NCC), a satellite control center (SCC), a wired and/or wireless core network and/or any other components or systems used to facilitate operation of and/or communication with the satellite communication system 100.

Communications between the satellite 300 and the gateway 200 in both directions are called feeder links, whereas communications between the satellite and each of the UTs 400 and 401 in both directions are called service links. A signal path from the satellite 300 to a ground station, which may be the gateway 200 or one of the UTs 400 and 401, may be generically called a downlink. A signal path from a ground station to the satellite 300 may be generically called an uplink. Additionally, as illustrated, signals can have a general directionality such as a forward link and a return link or reverse link. Accordingly, a communication link in a direction originating from the gateway 200 and terminating at the UT 400 through the satellite 300 is called a forward link, whereas a communication link in a direction originating from the UT 400 and terminating at the gateway 200 through the satellite 300 is called a return link or reverse link. As such, the signal path from the gateway 200 to the satellite 300 is labeled "Forward Feeder Link" whereas the signal path from the satellite 300 to the gateway 200 is labeled "Return Feeder Link" in FIG. 1. In a similar manner, the signal path from each UT 400 or 401 to the satellite 300 is labeled "Return Service Link" whereas the signal path from the satellite 300 to each UT 400 or 401 is labeled "Forward Service Link" in FIG. 1.

Figure 2:
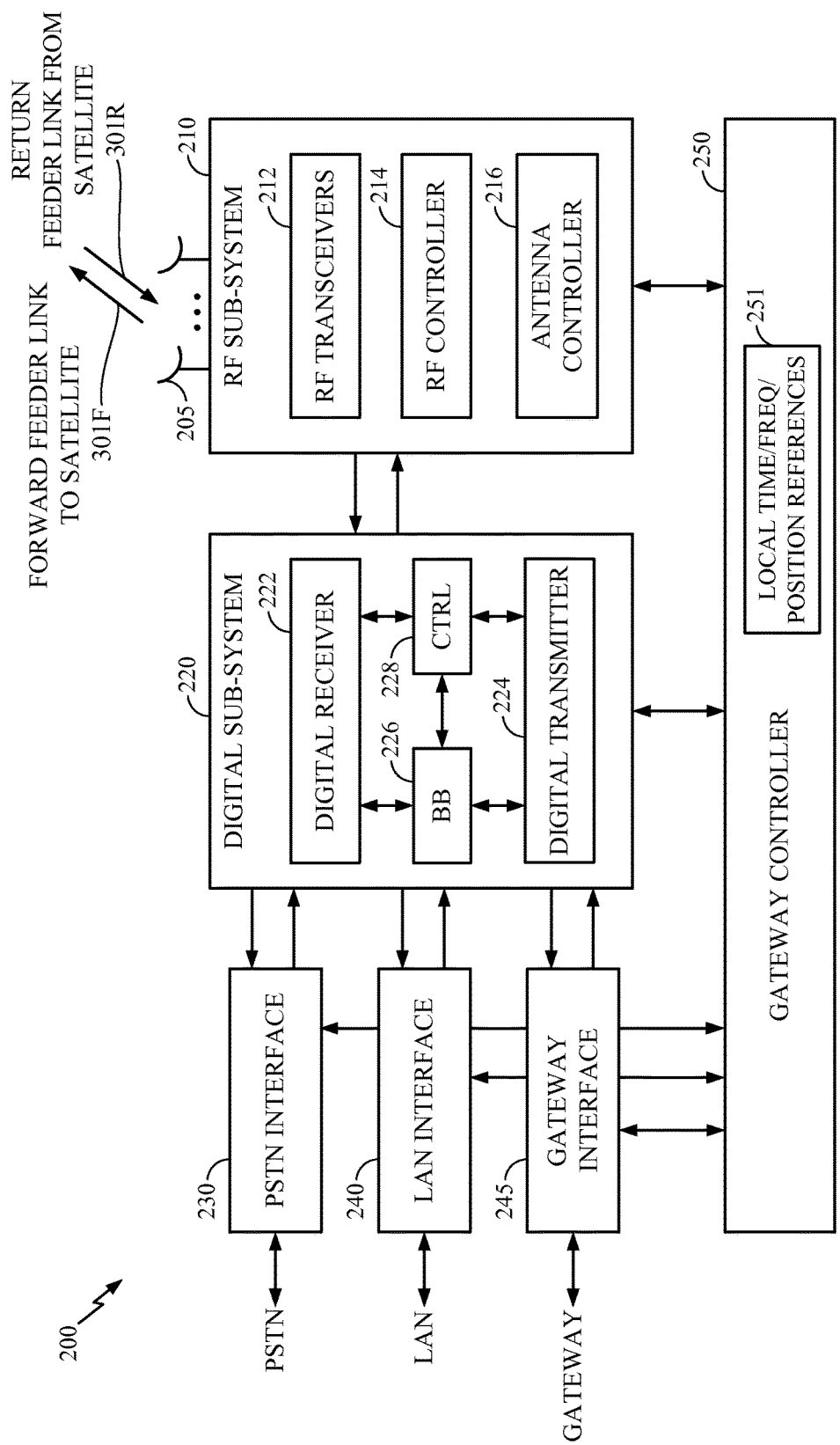
FIG. 2 is a block diagram of one example of the gateway of FIG. 1.

FIG. 2 is an example block diagram of gateway 200, which also can apply to gateway 201 of FIG. 1. Gateway 200 is shown to include a number of antennas 205, an RF subsystem 210, a digital subsystem 220, a Public Switched Telephone Network (PSTN) interface 230, a Local Area Network (LAN) interface 240, a gateway interface 245, and a gateway controller 250. RF subsystem 210 is coupled to antennas 205 and to digital subsystem 220. Digital subsystem 220 is coupled to PSTN interface 230, to LAN interface 240, and to gateway interface 245. Gateway controller 250 is coupled to RF subsystem 210, digital subsystem 220, PSTN interface 230, LAN interface 240, and gateway interface 245.

RF subsystem 210, which may include a number of RF transceivers 212, an RF controller 214, and an antenna controller 216, may transmit communication signals to satellite 300 via a forward feeder link 301F, and may receive communication signals from satellite 300 via a return feeder link 301R. Although not shown for simplicity, each of the RF transceivers 212 may include a transmit chain and a receive chain. Each receive chain may include a low noise amplifier (LNA) and a down-converter (e.g., a mixer) to amplify and down-convert, respectively, received communication signals in a well-known manner. In addition, each receive chain may include an analog-to-digital converter (ADC) to convert the received communication signals from analog signals to digital signals (e.g., for processing by digital subsystem 220). Each transmit chain may include an up-converter (e.g., a mixer) and a power amplifier (PA) to up-convert and amplify, respectively, communication signals to be transmitted to satellite 300 in a well-known manner. In addition, each transmit chain may include a digital-to-analog converter (DAC) to convert the digital signals received from digital subsystem 220 to analog signals to be transmitted to satellite 300.

The RF controller 214 may be used to control various aspects of the number of RF transceivers 212 (e.g., selection of the carrier frequency, frequency and phase calibration, gain settings, and the like). The antenna controller 216 may control various aspects of the antennas 205 (e.g., beamforming, beam steering, gain settings, frequency tuning, and the like).

The digital subsystem 220 may include a number of digital receiver modules 222, a number of digital transmitter modules 224, a baseband (BB) processor 226, and a control (CTRL) processor 228. Digital subsystem 220 may process communication signals received from RF subsystem 210 and forward the processed communication signals to PSTN interface 230 and/or LAN interface 240, and may process communication signals received from PSTN interface 230 and/or LAN interface 240 and forward the processed communication signals to RF subsystem 210.

Each digital receiver module 222 may correspond to signal processing elements used to manage communications between gateway 200 and UT 400. One of the receive chains of RF transceivers 212 may provide input signals to multiple digital receiver modules 222. A number of digital receiver modules 222 may be used to accommodate all of the satellite beams and possible diversity mode signals being handled at any given time. Although not shown for simplicity, each digital receiver module 222 may include one or more digital data receivers, a searcher receiver, and a diversity combiner and decoder circuit. The searcher receiver may be used to search for appropriate diversity modes of carrier signals, and may be used to search for pilot signals (or other relatively fixed pattern strong signals).

The digital transmitter modules 224 may process signals to be transmitted to UT 400 via satellite 300. Although not shown for simplicity, each digital transmitter module 224 may include a transmit modulator that modulates data for transmission. The transmission power of each transmit modulator may be controlled by a corresponding digital transmit power controller (not shown for simplicity) that may (1) apply a minimum level of power for purposes of interference reduction and resource allocation and (2) apply appropriate levels of power when needed to compensate for attenuation in the transmission path and other path transfer characteristics.

The control processor 228, which is coupled to digital receiver modules 222, digital transmitter modules 224, and baseband processor 226, may provide command and control signals to effect functions such as, but not limited to, signal processing, timing signal generation, power control, handoff control, diversity combining, and system interfacing.

The control processor 228 may also control the generation and power of pilot, synchronization, and paging channel signals and their coupling to the transmit power controller (not shown for simplicity). The pilot channel is a signal that is not modulated by data, and may use a repetitive unchanging pattern or non-varying frame structure type (pattern) or tone type input. For example, the orthogonal function used to form the channel for the pilot signal generally has a constant value, such as all 1's or 0's, or a well-known repetitive pattern, such as a structured pattern of interspersed 1's and 0's.

Baseband processor 226 is well known in the art and is therefore not described in detail herein. For example, the baseband processor 226 may include a variety of known elements such as (but not limited to) coders, data modems, and digital data switching and storage components.

The PSTN interface 230 may provide communication signals to, and receive communication signals from, an external PSTN either directly or through additional infrastructure 106, as illustrated in FIG. 1. The PSTN interface 230 is well known in the art, and therefore is not described in detail herein. For other implementations, the PSTN interface 230 may be omitted, or may be replaced with any other suitable interface that connects gateway 200 to a ground-based network (e.g., the Internet).

The LAN interface 240 may provide communication signals to, and receive communication signals from, an external LAN. For example, LAN interface 240 may be coupled to the Internet 108 either directly or through additional infrastructure 106, as illustrated in FIG. 1. The LAN interface 240 is well known in the art, and therefore is not described in detail herein.

The gateway interface 245 may provide communication signals to, and receive communication signals from, one or more other gateways associated with the satellite communication system 100 of FIG. 1 (and/or to/from gateways associated with other satellite communication systems, not shown for simplicity). For some implementations, gateway interface 245 may communicate with other gateways via one or more dedicated communication lines or channels (not shown for simplicity). For other implementations, gateway interface 245 may communicate with other gateways using PSTN 110 and/or other networks such as the Internet 108 (see also FIG. 1). For at least one implementation, gateway interface 245 may communicate with other gateways via infrastructure 106.

Overall gateway control may be provided by gateway controller 250. The gateway controller 250 may plan and control utilization of satellite 300's resources by gateway 200. For example, the gateway controller 250 may analyze trends, generate traffic plans, allocate satellite resources, monitor (or track) satellite positions, and monitor the performance of gateway 200 and/or satellite 300. The gateway controller 250 may also be coupled to a ground-based satellite controller (not shown for simplicity) that maintains and monitors orbits of satellite 300, relays satellite usage information to gateway 200, tracks the positions of satellite 300, and/or adjusts various channel settings of satellite 300.

For the example implementation illustrated in FIG. 2, the gateway controller 250 includes a local time, frequency, and position references 251, which may provide local time and frequency information to the RF subsystem 210, the digital subsystem 220, and/or the interfaces 230, 240, and 245. The time and frequency information may be used to synchronize the various components of gateway 200 with each other and/or with satellite(s) 300. The local time, frequency, and position references 251 may also provide position information (e.g., ephemeris data) of satellite(s) 300 to the various components of gateway 200. Further, although depicted in FIG. 2 as included within gateway controller 250, for other implementations, the local time, frequency, and position references 251 may be a separate subsystem that is coupled to gateway controller 250 (and/or to one or more of digital subsystem 220 and RF subsystem 210).

Although not shown in FIG. 2 for simplicity, the gateway controller 250 may also be coupled to a network control center (NCC) and/or a satellite control center (SCC). For example, the gateway controller 250 may allow the SCC to communicate directly with satellite(s) 300, for example, to retrieve ephemeris data from satellite(s) 300. The gateway controller 250 may also receive processed information (e.g., from the SCC and/or the NCC) that allows gateway controller 250 to properly aim its antennas 205 (e.g., at the appropriate satellite(s) 300), to schedule beam transmissions, to coordinate handovers, and to perform various other well-known functions.

Figure 3:
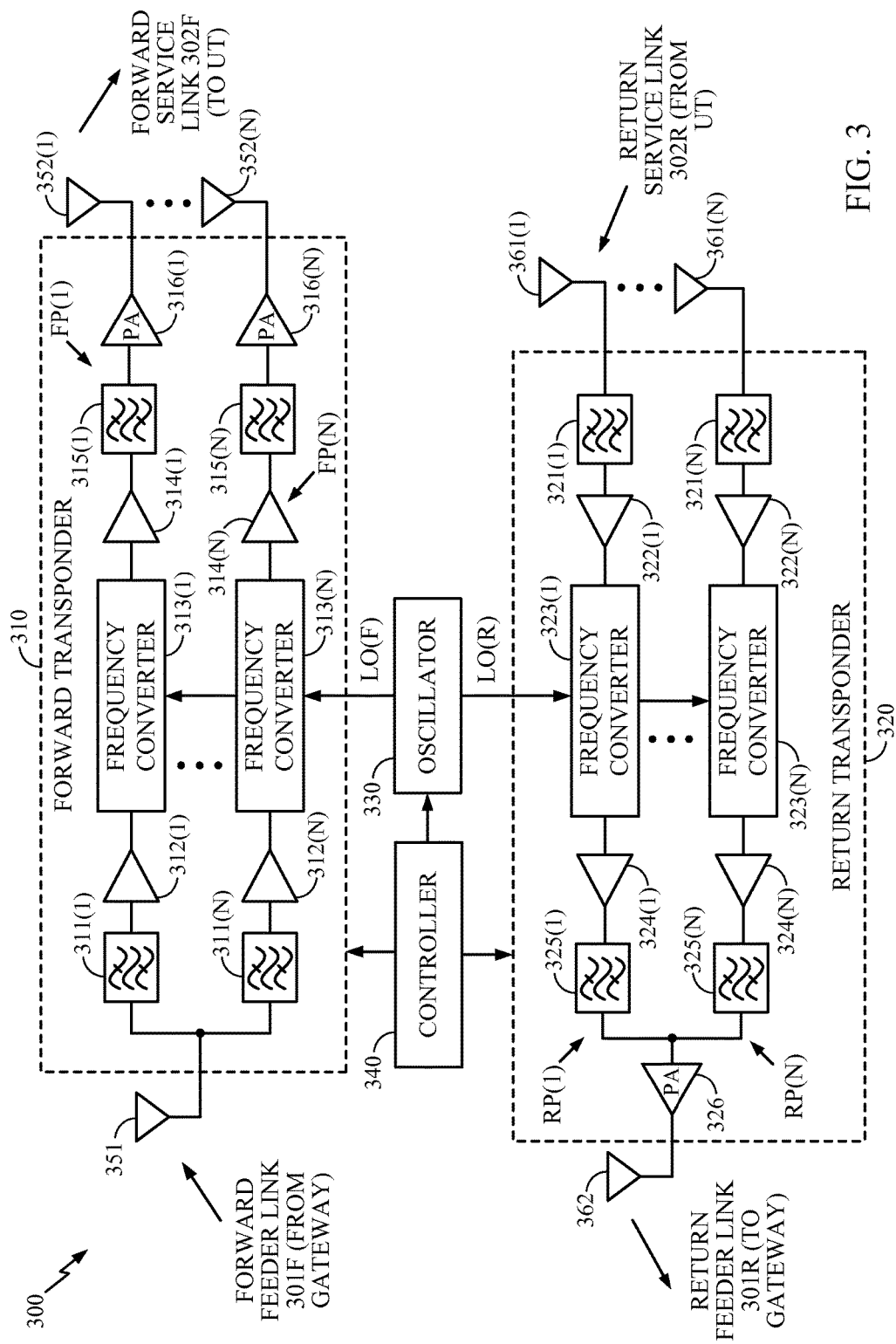
FIG. 3 is a block diagram of one example of the satellite of FIG. 1.

FIG. 3 is an example block diagram of satellite 300 for illustrative purposes only. It will be appreciated that specific satellite configurations can vary significantly and may or may not include on-board processing. Further, although illustrated as a single satellite, two or more satellites using inter-satellite communication may provide the functional connection between the gateway 200 and UT 400. It will be appreciated that disclosure is not limited to any specific satellite configuration and any satellite or combinations of satellites that can provide the functional connection between the gateway 200 and UT 400 can be considered within the scope of the disclosure. In one example, satellite 300 is shown to include a forward transponder 310, a return transponder 320, an oscillator 330, a controller 340, forward link antennas 351-352, and return link antennas 361-362. The forward transponder 310, which may process communication signals within a corresponding channel or frequency band, may include a respective one of first bandpass filters 311(1)-311(N), a respective one of first LNAs 312(1)-312(N), a respective one of frequency converters 313(1)-313(N), a respective one of second LNAs 314(1)-314(N), a respective one of second bandpass filters 315(1)-315(N), and a respective one of PAs 316(1)-316(N). Each of the PAs 316(1)-316(N) is coupled to a respective one of antennas 352(1)-352(N), as shown in FIG. 3.

Within each of the respective forward paths FP(1)-FP(N), the first bandpass filter 311 passes signal components having frequencies within the channel or frequency band of the respective forward path FP, and filters signal components having frequencies outside the channel or frequency band of the respective forward path FP. Thus, the pass band of the first bandpass filter 311 corresponds to the width of the channel associated with the respective forward path FP. The first LNA 312 amplifies the received communication signals to a level suitable for processing by the frequency converter 313. The frequency converter 313 converts the frequency of the communication signals in the respective forward path FP (e.g., to a frequency suitable for transmission from satellite 300 to UT 400). The second LNA 314 amplifies the frequency-converted communication signals, and the second bandpass filter 315 filters signal components having frequencies outside of the associated channel width. The PA 316 amplifies the filtered signals to a power level suitable for transmission to UTs 400 via respective antenna 352. The return transponder 320, which includes a number N of return paths RP(1)-RP(N), receives communication signals from UT 400 along return service link 302R via antennas 361(1)-361(N), and transmits communication signals to gateway 200 along return feeder link 301R via one or more antennas 362. Each of the return paths RP(1)-RP(N), which may process communication signals within a corresponding channel or frequency band, may be coupled to a respective one of antennas 361(1)-361(N), and may include a respective one of first bandpass filters 321(1)-321(N), a respective one of first LNAs 322(1)-322(N), a respective one of frequency converters 323(1)-323(N), a respective one of second LNAs 324(1)-324(N), and a respective one of second bandpass filters 325(1)-325(N).

Within each of the respective return paths RP(1)-RP(N), the first bandpass filter 321 passes signal components having frequencies within the channel or frequency band of the respective return path RP, and filters signal components having frequencies outside the channel or frequency band of the respective return path RP. Thus, the pass band of the first bandpass filter 321 may for some implementations correspond to the width of the channel associated with the respective return path RP. The first LNA 322 amplifies all the received communication signals to a level suitable for processing by the frequency converter 323. The frequency converter 323 converts the frequency of the communication signals in the respective return path RP (e.g., to a frequency suitable for transmission from satellite 300 to gateway 200). The second LNA 324 amplifies the frequency-converted communication signals, and the second bandpass filter 325 filters signal components having frequencies outside of the associated channel width. Signals from the return paths RP(1)-RP(N) are combined and provided to the one or more antennas 362 via a PA 326. The PA 326 amplifies the combined signals for transmission to the gateway 200.

Oscillator 330, which may be any suitable circuit or device that generates an oscillating signal, provides a forward local oscillator signal LO(F) to the frequency converters 313(1)-313(N) of forward transponder 310, and provides a return local oscillator signal LO(R) to frequency converters 323(1)-323(N) of return transponder 320. For example, the LO(F) signal may be used by frequency converters 313(1)-313(N) to convert communication signals from a frequency band associated with the transmission of signals from gateway 200 to satellite 300 to a frequency band associated with the transmission of signals from satellite 300 to UT 400. The LO(R) signal may be used by frequency converters 323(1)-323(N) to convert communication signals from a frequency band associated with the transmission of signals from UT 400 to satellite 300 to a frequency band associated with the transmission of signals from satellite 300 to gateway 200.

Controller 340, which is coupled to forward transponder 310, return transponder 320, and oscillator 330, may control various operations of satellite 300 including (but not limited to) channel allocations. In one aspect, the controller 340 may include a memory coupled to a processor (not shown for simplicity). The memory may include a non-transitory computer-readable medium (e.g., one or more nonvolatile memory elements, such as EPROM, EEPROM, Flash memory, a hard drive, etc.) storing instructions that, when executed by the processor, cause the satellite 300 to perform operations including (but not limited to) those described herein.

Figure 4:
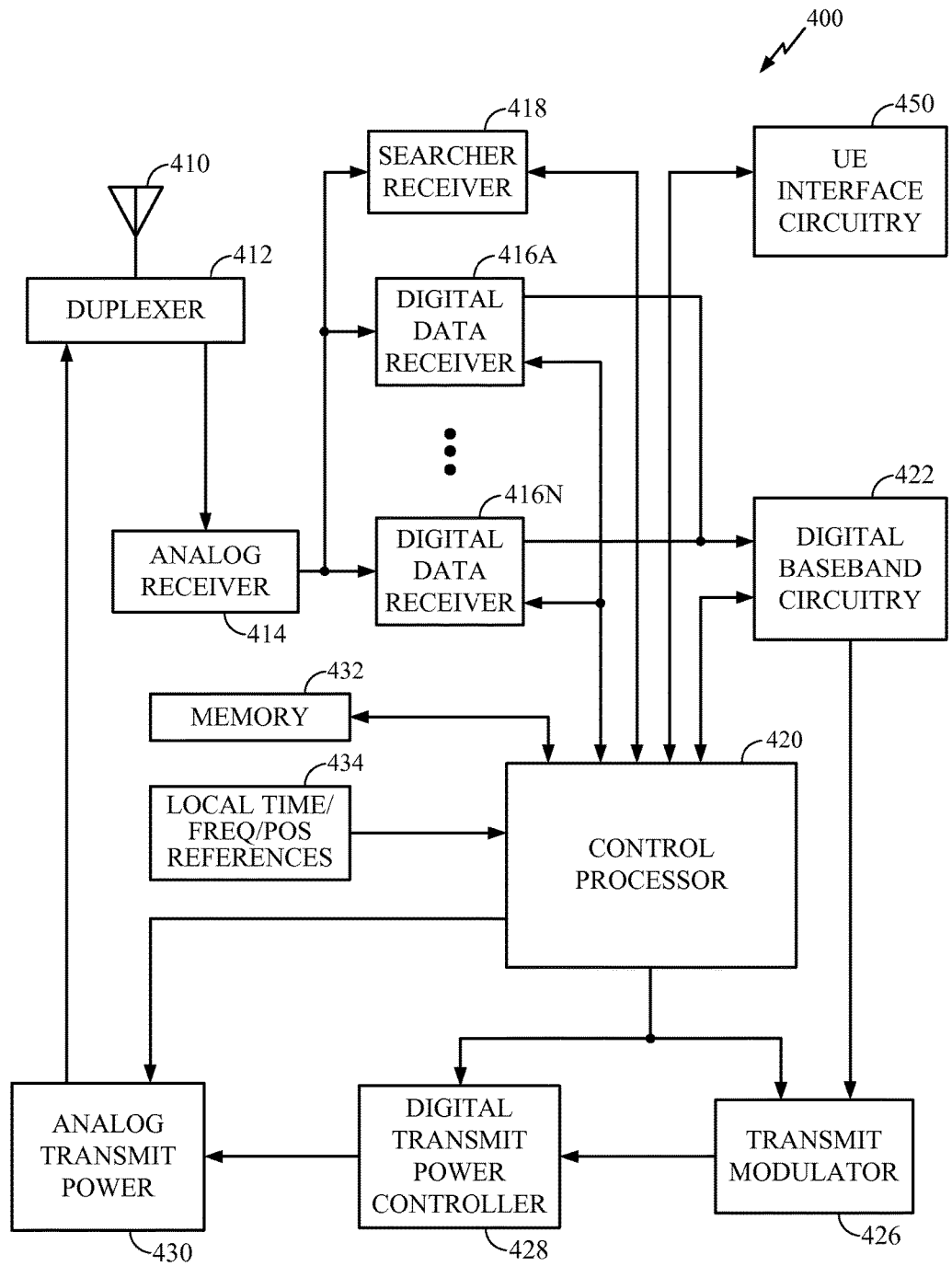
FIG. 4 is a block diagram of one example of the user terminal of FIG. 1.

An example of a transceiver for use in the UT 400 or 401 is illustrated in FIG. 4. In FIG. 4, at least one antenna 410 is provided for receiving forward link communication signals (e.g., from satellite 300), which are transferred to an analog receiver 414, where they are down-converted, amplified, and digitized. A duplexer element 412 is often used to allow the same antenna to serve both transmit and receive functions. Alternatively, a UT transceiver may employ separate antennas for operating at different transmit and receive frequencies.

The digital communication signals output by the analog receiver 414 are transferred to at least one digital data receiver 416A and at least one searcher receiver 418. Additional digital data receivers to 416N can be used to obtain desired levels of signal diversity, depending on the acceptable level of transceiver complexity, as would be apparent to one skilled in the relevant art.

At least one user terminal control processor 420 is coupled to digital data receivers 416A-416N and searcher receiver 418. The control processor 420 provides, among other functions, basic signal processing, timing, power and handoff control or coordination, and selection of frequency used for signal carriers. Another basic control function that may be performed by the control processor 420 is the selection or manipulation of functions to be used for processing various signal waveforms. Signal processing by the control processor 420 can include a determination of relative signal strength and computation of various related signal parameters. Such computations of signal parameters, such as timing and frequency may include the use of additional or separate dedicated circuitry to provide increased efficiency or speed in measurements or improved allocation of control processing resources.

The outputs of digital data receivers 416A-416N are coupled to digital baseband circuitry 422 within the user terminal. The digital baseband circuitry 422 comprises processing and presentation elements used to transfer information to and from UE 500 as shown in FIG. 1, for example. Referring to FIG. 4, if diversity signal processing is employed, the digital baseband circuitry 422 may comprise a diversity combiner and decoder. Some of these elements may also operate under the control of, or in communication with, a control processor 420.

When voice or other data is prepared as an output message or communications signal originating with the user terminal, the digital baseband circuitry 422 is used to receive, store, process, and otherwise prepare the desired data for transmission. The digital baseband circuitry 422 provides this data to a transmit modulator 426 operating under the control of the control processor 420. The output of the transmit modulator 426 is transferred to a power controller 428 which provides output power control to a transmit power amplifier 430 for final transmission of the output signal from the antenna 410 to a satellite (e.g., satellite 300).

In FIG. 4, the UT transceiver also includes a memory 432 associated with the control processor 420. The memory 432 may include instructions for execution by the control processor 420 as well as data for processing by the control processor 420. In the example illustrated in FIG. 4, the memory 432 includes instructions to perform some or all of the processes discussed with respect to FIGS. 9 and 11.

In the example illustrated in FIG. 4, the UT 400 also includes an optional local time, frequency and/or position references 434 (e.g., a GPS receiver), which may provide local time, frequency and/or position information to the control processor 420 for various applications, including, for example, time and frequency synchronization for the UT 400.

Digital data receivers 416A-N and searcher receiver 418 are configured with signal correlation elements to demodulate and track specific signals. Searcher receiver 418 is used to search for pilot signals, or other relatively fixed pattern strong signals, while digital data receivers 416A-N are used to demodulate other signals associated with detected pilot signals. However, a digital data receiver 416 can be assigned to track the pilot signal after acquisition to accurately determine the ratio of signal chip energies to signal noise, and to formulate pilot signal strength. Therefore, the outputs of these units can be monitored to determine the energy in, or frequency of, the pilot signal or other signals. These receivers also employ frequency tracking elements that can be monitored to provide current frequency and timing information to control processor 420 for signals being demodulated.

The control processor 420 may use such information to determine to what extent the received signals are offset from the oscillator frequency, when scaled to the same frequency band, as appropriate. This and other information related to frequency errors and frequency shifts can be stored in a storage or memory element 432 as desired.

The control processor 420 may also be coupled to UE interface circuitry 450 to allow communications between UT 400 and one or more UEs. UE interface circuitry 450 may be configured as desired for communication with various UE configurations and accordingly may include various transceivers and related components depending on the various communication technologies employed to communicate with the various UEs supported. For example, UE interface circuitry 450 may include one or more antennas, a wide area network (WAN) transceiver, a wireless local area network (WLAN) transceiver, a Local Area Network (LAN) interface, a Public Switched Telephone Network (PSTN) interface and/or other known communication technologies configured to communicate with one or more UEs in communication with UT 400.

Figure 5:
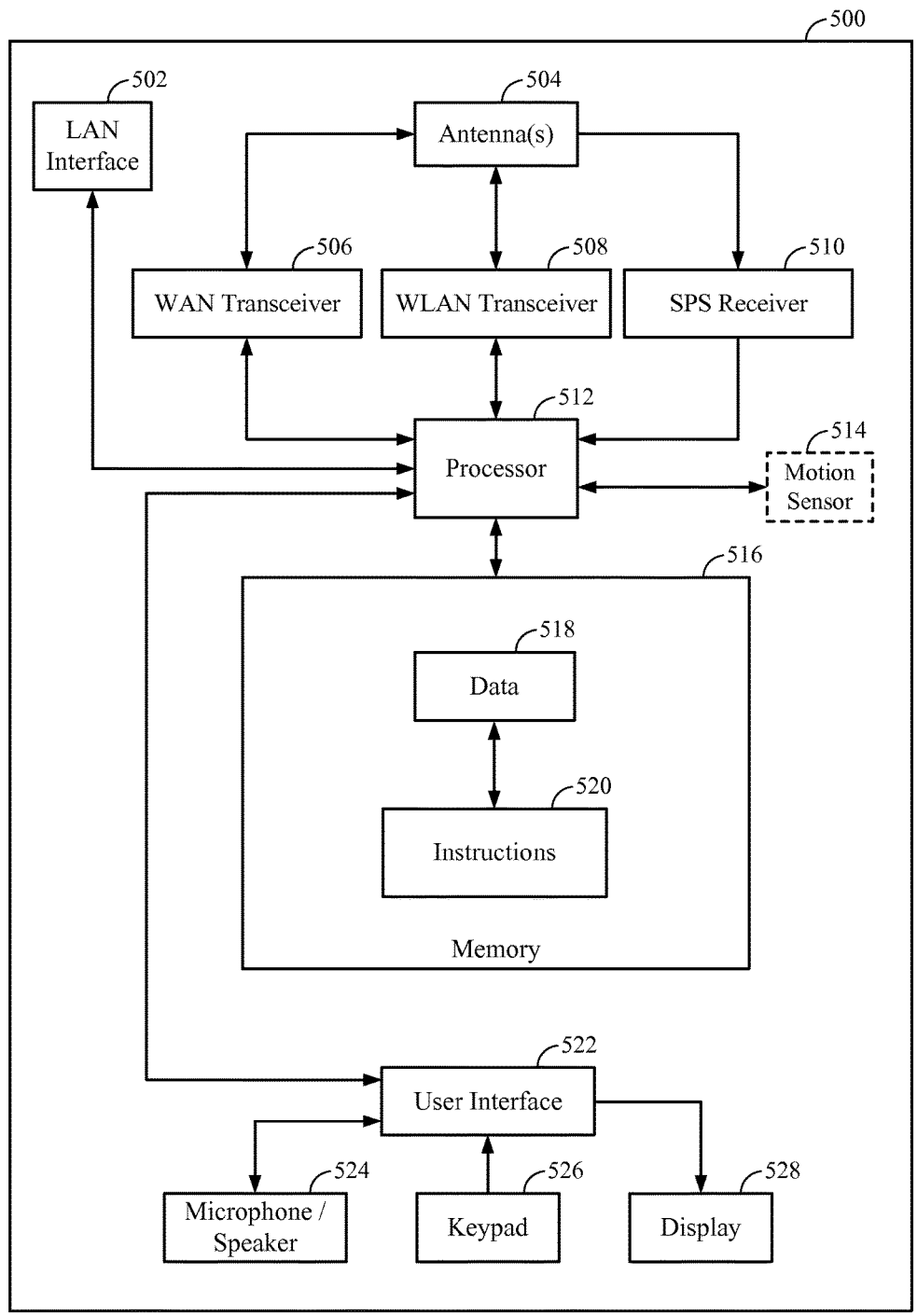
FIG. 5 is a block diagram of one example of the user equipment of FIG. 1.

FIG. 5 is a block diagram illustrating an example of UE 500, which also can apply to UE 501 of FIG. 1. The UE 500 as shown in FIG. 5 may be a mobile device, a handheld computer, a tablet, a wearable device, a smart watch, or any type of device capable of interacting with a user, for example. Additionally, the UE may be a network side device that provides connectivity to various ultimate end user devices and/or to various public or private networks. In the example shown in FIG. 5, the UE 500 may comprise a LAN interface 502, one or more antennas 504, a wide area network (WAN) transceiver 506, a wireless local area network (WLAN) transceiver 508, and a satellite positioning system (SPS) receiver 510. The SPS receiver 510 may be compatible with the Global Positioning System (GPS), the Global Navigation Satellite System (GLONASS) and/or any other global or regional satellite based positioning system. In an alternate aspect, the UE 500 may include a WLAN transceiver 508, such as a Wi-Fi transceiver, with or without the LAN interface 502, WAN transceiver 506, and/or SPS receiver 510, for example. Further, UE 500 may include additional transceivers such as Bluetooth, ZigBee and other known technologies, with or without the LAN interface 502, WAN transceiver 506, WLAN transceiver 508 and/or SPS receiver 510. Accordingly, the elements illustrated for UE 500 are provided merely as an example configuration and are not intended to limit the configuration of UEs in accordance with the various aspects disclosed herein.

In the example shown in FIG. 5, a processor 512 is connected to the LAN interface 502, the WAN transceiver 506, the WLAN transceiver 508 and the SPS receiver 510. Optionally, a motion sensor 514 and other sensors may also be coupled to the processor 512.

A memory 516 is connected to the processor 512. In one aspect, the memory 516 may include data 518 that may be transmitted to and/or received from the UT 400, as shown in FIG. 1. Referring to FIG. 5, the memory 516 may also include stored instructions 520 to be executed by the processor 512 to perform the process steps for communicating with the UT 400. Furthermore, the UE 500 may also include a user interface 522, which may include hardware and software for interfacing inputs or outputs of the processor 512 with the user through light, sound or tactile inputs or outputs, for example. In the example shown in FIG. 5, the UE 500 includes a microphone/speaker 524, a keypad 526, and a display 528 connected to the user interface 522. Alternatively, the user's tactile input or output may be integrated with the display 528 by using a touch-screen display, for example. Once again, the elements illustrated in FIG. 5 are not intended to limit the configuration of the UEs disclosed herein and it will be appreciated that the elements included in the UE 500 will vary based on the end use of the device and the design choices of the system engineers.

Additionally, the UE 500 may be a user device such as a mobile device or external network side device in communication with but separate from the UT 400 as illustrated in FIG. 1, for example. Alternatively, the UE 500 and the UT 400 may be integral parts of a single physical device.

Figure 6:
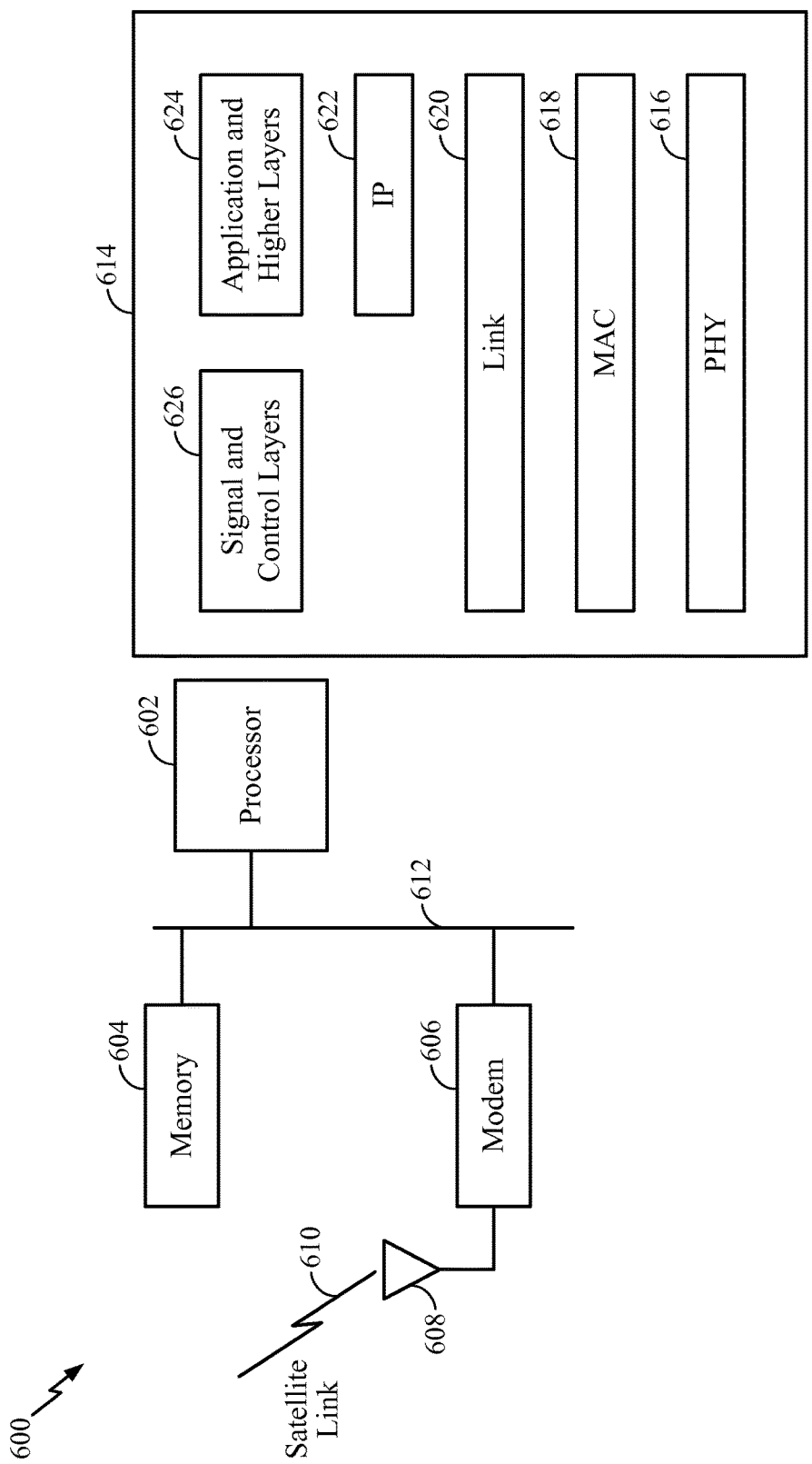
FIG. 6 is a block diagram of one example of a signal processing system with a protocol stack representing the gateway or the user terminal of FIG. 1.

FIG. 6 illustrates a signal processing system 600 that abstracts some components of a UT or a gateway. Illustrated in FIG. 6 are a processor 602 (the term "processor" is to include multiple processor cores on one or more chips), a memory 604, and a modem 606 coupled to the antenna 608. The satellite link 610 may represent any one of the satellite links in FIG. 1 originating from the gateway 200 or the UTs 400 or 401 and terminating at the satellite 300. The antenna 610 may be configured for transmitting right-hand polarized electromagnetic radiation or left-hand polarized electromagnetic radiation, and may comprise multiple elements for beam steering. For ease of illustration, a single bus, denoted as the bus 612, allows communication among the components in FIG. 6, but in practice a UT or a gateway may utilize one or more busses and one or more point-to-point interconnects, or other types of interconnection technology.

The signal processing system 600 may implement one or more protocol stacks, such as for example the protocol stack 614. For ease of illustration, the protocol stack 614 does not show all layers in a typical protocol stack. Illustrated in the protocol stack 614 are the physical layer (PHY) 616, the media access control layer (MAC) 618, and the link layer 620. The PHY 616 provides RF (Radio Frequency) modulation and demodulation for signals transmitted and received via the antenna 608, the PHY 616 and MAC 618 provide framing, encoding and decoding (e.g., block coding, convolutional coding, turbo coding), and the link layer 620 provides functionality so that data may be multiplexed and demultiplexed. The above functional descriptions of the PHY 616, MAC 618, and the link layer 620 are not meant to be exhaustive or exclusive, but are merely provided to indicate that their functionalities are similar to some of the protocol layers in the Open Systems Interconnection model (OSI) model.

Above the link layer 620 are additional layers for accessing the Internet or using voice over Internet Protocol (VoIP), such as for example the Internet Protocol (IP) layer 622 and additional layers, referred to in FIG. 6 as the application and higher layers 624. The application and higher layers 624 and the IP layer 622, together with the layers below them, define a communication plane for providing VoIP, web surfing, and other communication functionalities.

Other layers above the link layer 620 may define other planes. For example, the layer in FIG. 6 referred to as the signal and control layers 626 provides additional functionality in the way of a signal plane and a control plane so that a voice call may be set up and various parameters may be set (controlled).

Some of the functionality of the layers in the protocol stack 614 may be performed by software running on the processor 602, and some of the functionality may be performed by hardware under control of firmware. In some instances, some of the functionality of the layers in the protocol stack 614 may be performed by special purpose hardware, for example application specific integrated circuits (ASIC), or field programmable gate arrays (FPGA). For example, the modem 606 may perform some or all of the functionality of the PHY 616. The software for performing some of the functionality of the protocol stack 614, as well as further functionality to be described, may be stored in the memory 604. The memory 604 may represent a memory hierarchy, and may be referred to as a non-transitory computer-readable media.

The signal processing system 600 may implement multiple instances of the protocol stack 614, as well as other protocol stacks to communicate with other devices, such as for example the UE 500 or 501. A protocol stack provides functionality to realize multiple physical and logical channels for forward or return links.

Figure 7A:
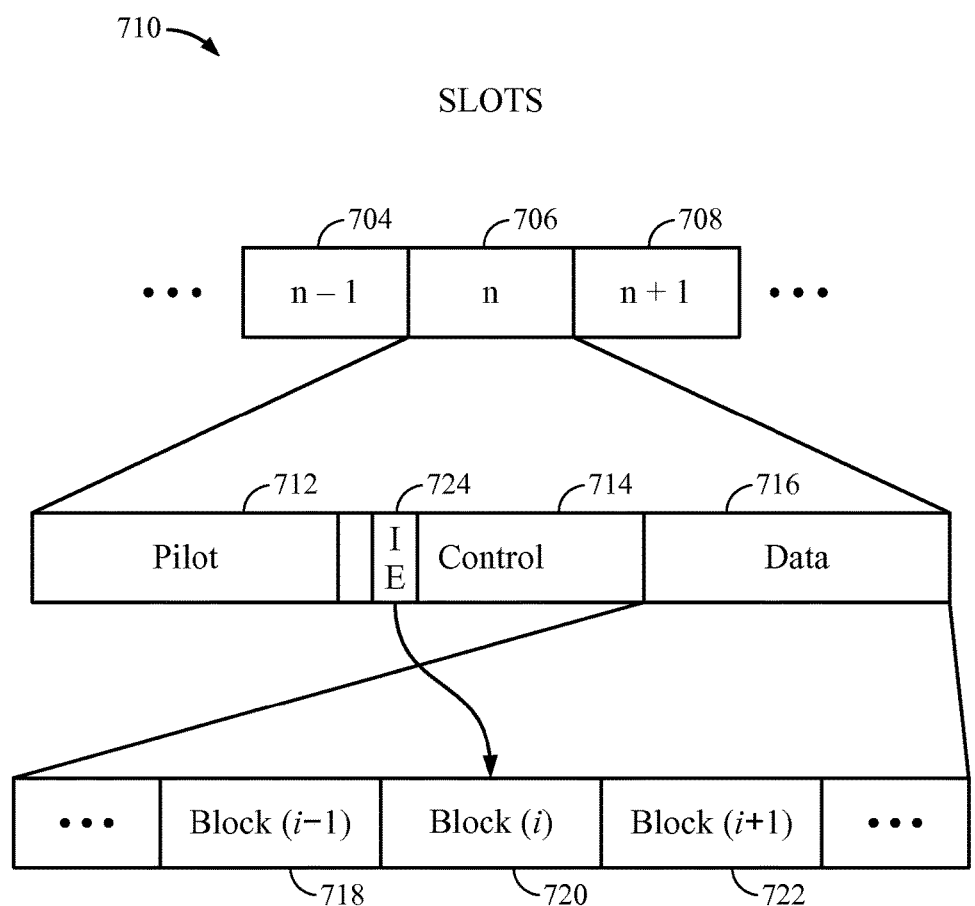
FIG. 7A illustrates one example of a communication structure used by the gateway of FIG. 1.

FIG. 7A illustrates a communication structure 710 for a forward link. A plurality of slots is transmitted from the gateway 200 to multiple UTs, where three slots are illustrated: the $(n-1)^{th}$ slot 704, the $n^{th}$ slot 706, and the $(n+1)^{th}$ slot 708. A slot represents the smallest unit of transmission time, and its time duration may be referred to as a transmission time interval. A slot comprises three components: the pilot 712, the control 714, and the data 716. A slot may include other components. The pilot 712 comprises a pilot signal that may be used by a UT for synchronization, equalization, channel quality estimation, and so forth. The data 716 comprises data payload destined for one or more user terminals, and the control 714 includes information elements to describe the data 716 as discussed below.

The MAC 618 and PHY 616 can insert multiple blocks into the data 716, where each block is destined for a UT. More than one block in the data 716 may be destined for the same UT. Different blocks may have different lengths. In particular, to achieve flexibility, it is envisioned that various blocks at one time or another will likely occupy varying lengths within the data 716.

Information elements in the control 714 indicate how many blocks are contained in the data 716, which block belongs to which UT, and the relative positions and lengths of each of the blocks within the data 716. For example, three blocks within data 716 are illustrated: the block(i−1) 718, the block(i) 720, and the block(i+1) 722. The information element 724 comprises information relevant to one or more blocks within the data portion of a slot. For example, for the block(i), the information element 724 may provide its relative position and length within the data 716, which UT it is for, the type of coding scheme, and the type of modulation scheme. The information element 724 may include information relevant to other blocks, and it is immaterial whether one considers the information element 724 as having a single datum of information regarding a single block, information data regarding a single block, or information data regarding multiple blocks.

Figure 7B:
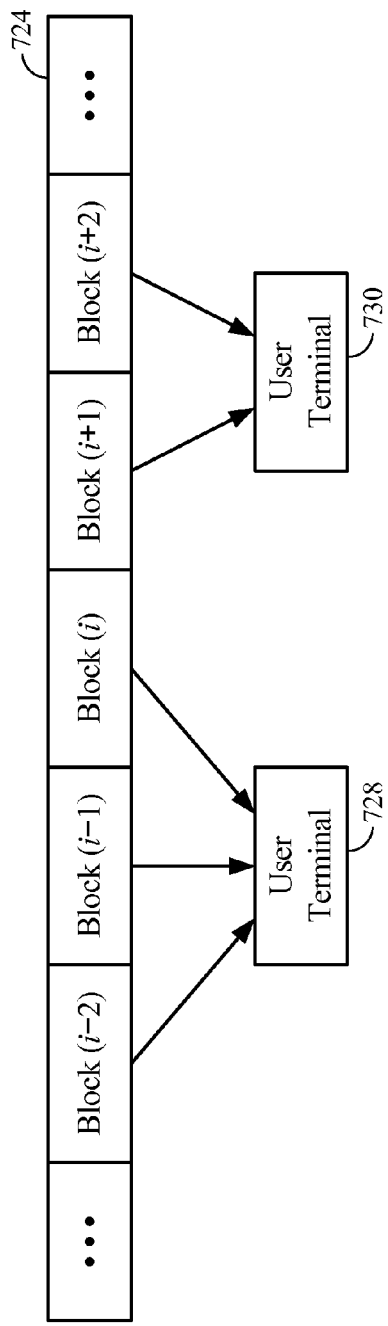
FIG. 7B illustrates one example of a mapping of blocks within the communication structure of FIG. 7A to user terminals.
Figure 7C:
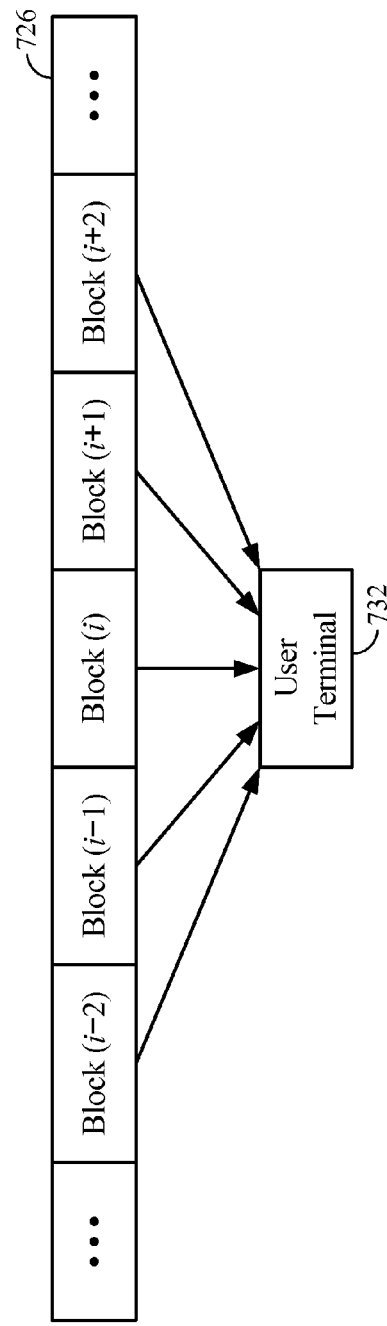
FIG. 7C illustrates another example of a mapping of blocks within the communication structure of FIG. 7A to user terminals.

The information element 724 may represent any one of a large number of possible mappings of blocks to user terminals. For example, the data 724 in FIG. 7B comprises the five blocks, block(i−2) through block(i+2), for some arbitrary index i. The data 724 may include additional blocks. Similar remarks apply to the data 726 illustrated in FIG. 7C. In FIG. 7B for the data 724, the three blocks, block(i−2), block(i−1), and block(i), are mapped to the UT 728, and the two blocks, block(i+1) and block(i+2), are mapped to the UT 730. In FIG. 7C for the data 726, the five blocks, block(i−2), block(i−1), block(i+1), and block(i+2), are mapped to the UT 732. Clearly, a large number of mappings are possible.

Various types of coding (encoding and decoding) schemes may be employed by the PHY 616 of FIG. 6, such as block coding, convolutional or turbo coding, and combinations thereof, such as for example concatenating coding in which an outer code is used with an inner code. Interleaving may also be employed, which may be considered to be part of the coding scheme. Consequently, a CRC (Cyclic Redundancy Check) may be generated from the information bits and appended to the information bits for error control.

The PHY 616 translates data symbols (e.g., bits) of a block into channel symbols. For example, every B bits in a block may be grouped together, and each such group mapped to a signal in a signal constellation space comprising at least $2^B$ signal points. The combination of modulation and coding may be represented by a value of an index, which for purposes of this description is referred to as an MCI (Modulation and Coding Index). The control 714 in FIG. 7A by way of information elements provides the values of the MCIs for the blocks. However, in some implementations a UT may employ blind detection and error control in which the MCI for the block it is decoding is not transmitted along with the block. Regardless of whether the MCIs are transmitted or not, different modulation and coding schemes may be employed for the various blocks, so that multiple modulation and coding schemes may be used for multiple blocks in one slot destined for one or more UTs.

The various satellite communication links may utilize various accessing schemes, such as for example single carrier TDMA. The signal constellation space may represent any one of a number of well-known modulation techniques, for example PSK (Phase shift Keying), QPSK (Quadrature Phase Shift Keying), or different levels of QAM (Quadrature Amplitude Modulation), e.g., 16-QAM, 64-QAM, and so forth.

Figure 8:
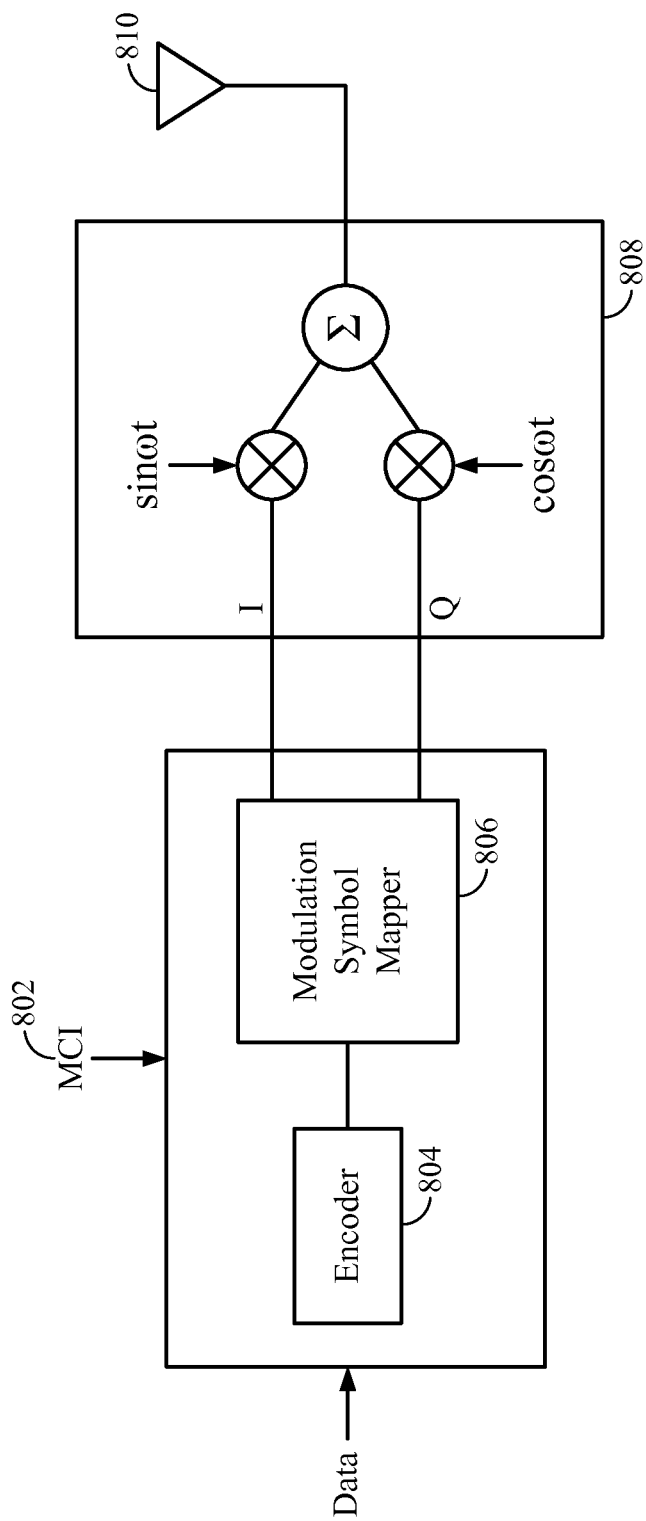
FIG. 8 illustrates one example of a signal processing chain used by the user terminal or the gateway of FIG. 1.

FIG. 8 illustrates a signal processing chain for the PHY 616 to perform encoding and modulation. Based upon the value of the MCI 802, the encoder 804 encodes the information data, and may implement, as examples, a block encoder, a convolutional or turbo encoder, or a concatenated encoding scheme. The encoder 804 may include interleaving. The modulation symbol mapper 806 maps bit space into signal constellation space, whereby one or more bits are grouped together and mapped into a modulation symbol, as discussed previously. RF (Radio Frequency) modulation, symbolized by the RF modulator 808, translates the baseband signal to RF, where the RF output signal is fed to the antenna 810.

FIG. 8 may illustrate part of a signal processing chain of a UT or a gateway. Furthermore, the modulation and coding scheme used by a UT for transmission may not be the same as that used by a gateway for sending data to that UT.

A user terminal may determine the channel quality of its satellite communication link based upon various measured parameters, such as for example by measuring the signal-to-noise ratio or by computing a frame error rate (or bit error rate) accumulated over some period of time. This channel quality may be encoded into the value of an information element, which may be referred to as the channel state information (CSI). The value of the CSI for a UT (e.g., UT 400 or 401) may be transmitted to the gateway 200. Based upon the value of the CSI, in one implementation of the signal processing system 600, the gateway 200 assigns to the UT 400 or 401 a value for its MCI where the value is placed in the control 714 and used in the signal processing chain of FIG. 8 as discussed previously.

Because the coverage and channel propagation characteristics for the satellite 300 are changing over time, and depend upon the relative position of a user terminal to the satellite 300, different user terminals may experience different channel qualities for their respective communication links. As a result, a modulation and coding scheme appropriate for one UT may not be appropriate for another. That is, data for those user terminals having a relatively low quality satellite link may need a modulation and coding scheme with less spectral efficiency than for data intended for those user terminals having a higher quality link in order to achieve the same BLER (Block Error Rate). As a result, assigning different modulation and coding schemes to various blocks in one slot is expected to result in an overall efficiency in spectrum use.

In some system implementations, the UT 400 or 401 may determine their respective modulation and coding schemes, and in other implementations the gateway 200 may determine modulation and coding schemes. For example, the signal processing system 600 may store a lookup table by which values of the CSI map to values of the MCI, so that the appropriate modulation and coding scheme may be determined.

The modulation and coding scheme may also be varied for re-transmissions of blocks. For example, a relatively high spectral efficiency may be chosen for the initial transmission of a block, whereupon if the sender of the block (e.g., the gateway 200 or the UTs 400 or 401) determines that the block has been lost or received in error, then a new modulation and coding scheme is chosen for the re-transmission of the block to improve the BLER at the expense of spectral efficiency. For example, the PHY 616 may receive a NAK (negative acknowledgement) and determine that a block has been lost or received in error, in which case the processor 602 running the protocol stack 614 re-sets the MCI 802 so that less spectrally efficient modulation and coding is employed. (A convention may be chosen such that as the MCI value increases, so does the spectral efficiency, or at least, it doesn't decrease. That is, the spectral efficiency as a function of the MCI value may be viewed as an increasing function, but not necessarily a strictly increasing function. In this case, lowering the MCI value implies less spectrally efficient modulation and coding.)

Figure 9:
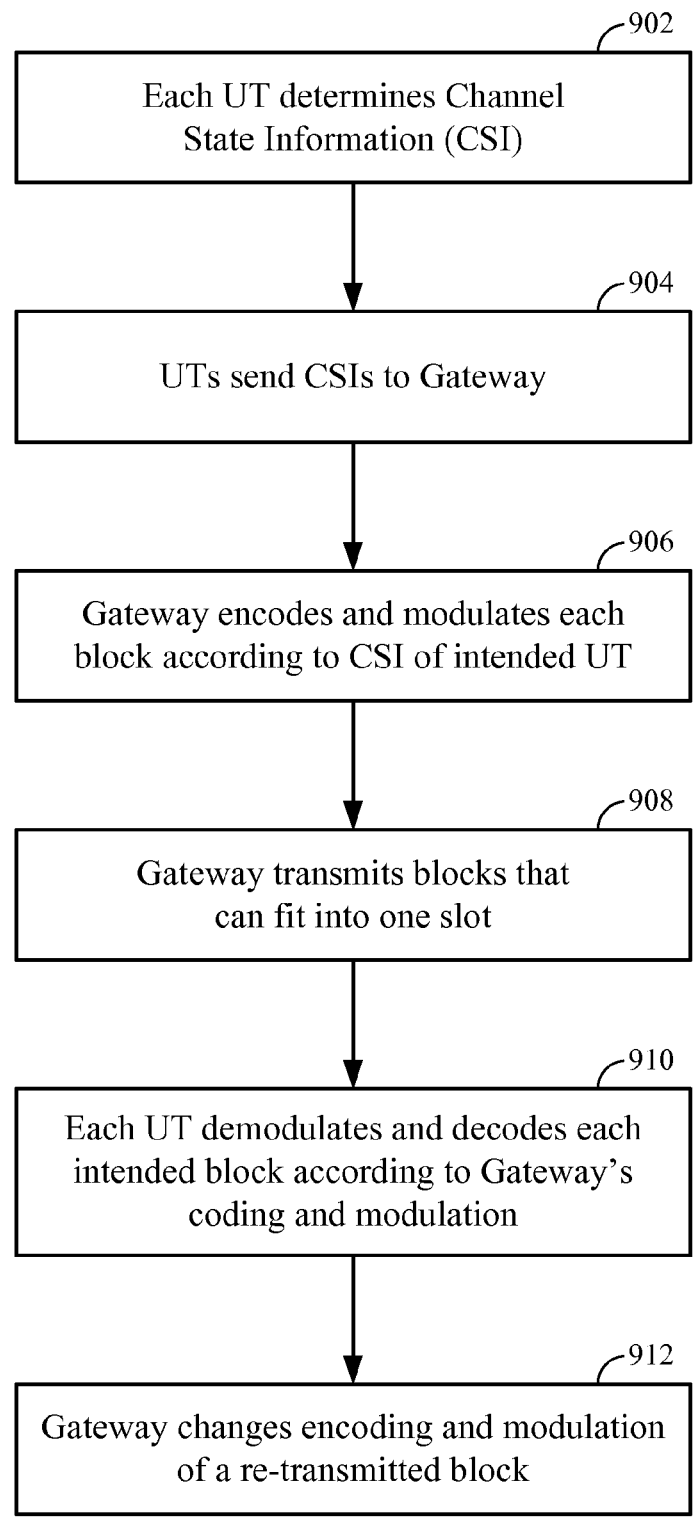
FIG. 9 illustrates processes and actions performed by the user terminal or the gateway of FIG. 1.

FIG. 9 represents various processes and procedures performed by a gateway and user terminals in a satellite communication system. The actions indicated in FIG. 9, although illustrated in an ordered flow diagram, are not necessarily performed in the order indicated in FIG. 9, nor are all such indicated actions necessarily performed by a gateway or a user terminal That is, some of the actions indicated in FIG. 9 are optional and need not be performed in a satellite communication system.

As described previously and illustrated in FIG. 9, as indicated in the action 902 a plurality of user terminals determine their respective CSIs based upon measurements such as signal-to-noise ratio, accumulated bit or frame error rate, or perhaps other parameters that are measured or obtained by the satellite 300. As indicated in the action 904, the user terminals send the values of their respective CSIs to the gateway 200 using the return link of the satellite communication system. In the action 906, the gateway 200 encodes and modulates each block based upon the CSI of its intended (corresponding) UT. As discussed above, the gateway may assign to each user terminal a particular modulation and coding scheme, indicated by a value of an MCI, based upon the CSI of that user terminal. In other implementations, the modulation and coding scheme may be determined by the gateway 200 without a CSI.

In the action 908, the gateway 200 transmits in a single slot the blocks that are encoded and modulated in the action 906 destined for the various user terminals, where the modulation and coding scheme for each block is based upon the scheme assigned to it by the gateway 200. In interpreting the actions of FIG. 9, use of the plural term "blocks" also includes the singular term "block," so that in the action 908 there may be only one block in a transmitted slot. In the action 910, the user terminals use their assigned modulation and coding schemes (indicated in their respective MCIs) to demodulate and decode their respective blocks.

As indicated in the action 912, if a block for a particular user terminal has been determined as lost or received in error, then the gateway upon re-transmission of that block in another slot may change the modulation and coding scheme, as indicated in the value of the assigned MCI. The new modulation and coding scheme (as indicated in a lower value of the MCI) is chosen to reduce the BLER at the expense of a reduction in spectral efficiency.

A communication system provides flexibility in spectral efficiency for modulation and coding for transmissions and re-transmissions. In one example implementation of a communication system, a first modulation and coding scheme is selected for the first transmission of a block, whether by a gateway to a user terminal via a satellite (the forward link), or by a user terminal to a gateway via a satellite (the return link); where if a block is lost or received in error, a second modulation and coding scheme is selected for re-transmission (a second transmission) of the block. The first transmission as compared to the second transmission has a relatively higher spectral efficiency.

For example, the second modulation and coding scheme may employ lower order modulation and lower rate turbo encoding relative to the first modulation and coding scheme. Furthermore, the first modulation and coding scheme does not use concatenated coding, but the second modulation and coding scheme may use concatenated coding, where a BCH code is used as an outer code with the turbo code as an inner code.

It is to be appreciated that a re-transmitted block may occupy a greater portion of a slot than when it was first transmitted. That is, a re-transmission may use more resources in time. For example, with a more robust coding scheme using more error control bits, the extra bits used for error correction results in a block occupying more symbol positions in a transmitted slot than compared to when that block was first transmitted (for the same modulation scheme). In practice, the first transmitted block may take up a relatively small fraction of a slot, so that upon re-transmission of that block it may be scheduled with fewer other blocks so that it may take up a larger fraction of its slot than when first transmitted, but where nevertheless the re-transmitted block may fit within a single slot. In this way, re-segmentation of the block may be avoided. (Note also that changing to a lower order modulation on a re-transmission may also contribute to a re-transmitted block taking up a larger fraction of a slot.) A communication system designed to avoid re-segmentation can ensure that a block in a first transmission only occupies a relatively small fraction of a slot. How small this fraction should be may be determined by how much more coding gain is desired in a re-transmission.

In some implementations, a communication system may be designed so that the first transmission of a block and each successive re-transmission of that block (e.g., a second transmission, a third transmission, and so forth) have a different target BLER. For example, consider a communication system in which a turbo code when used without an outer code has an error floor on the order of $10^{-4}$. First transmissions that have a target BLER of $10^{-3}$ have a target BLER greater than the error floor of the turbo code, so that a turbo code is used without an outer code. Re-transmissions that have a target BLER of $10^{-6}$ have a target BLER less than the error floor of the turbo code (when used without an outer code), in which case concatenated coding should be used, for example a turbo code as an inner code and a Bose-Chaudhuri-Hocquenghem (BCH) code as an outer code. The concatenated code should have an error floor less than $10^{-6}$.

In the above example, the first transmission of a block occupies a relatively small fraction of the slot. On a re-transmission, the block can take up a larger fraction of the slot compared to its first transmission, without the need to re-segment the block so as to avoid overflowing the slot. The communication structure illustrated in FIG. 7A enables the advantage of avoiding segmentation.

Figure 10:
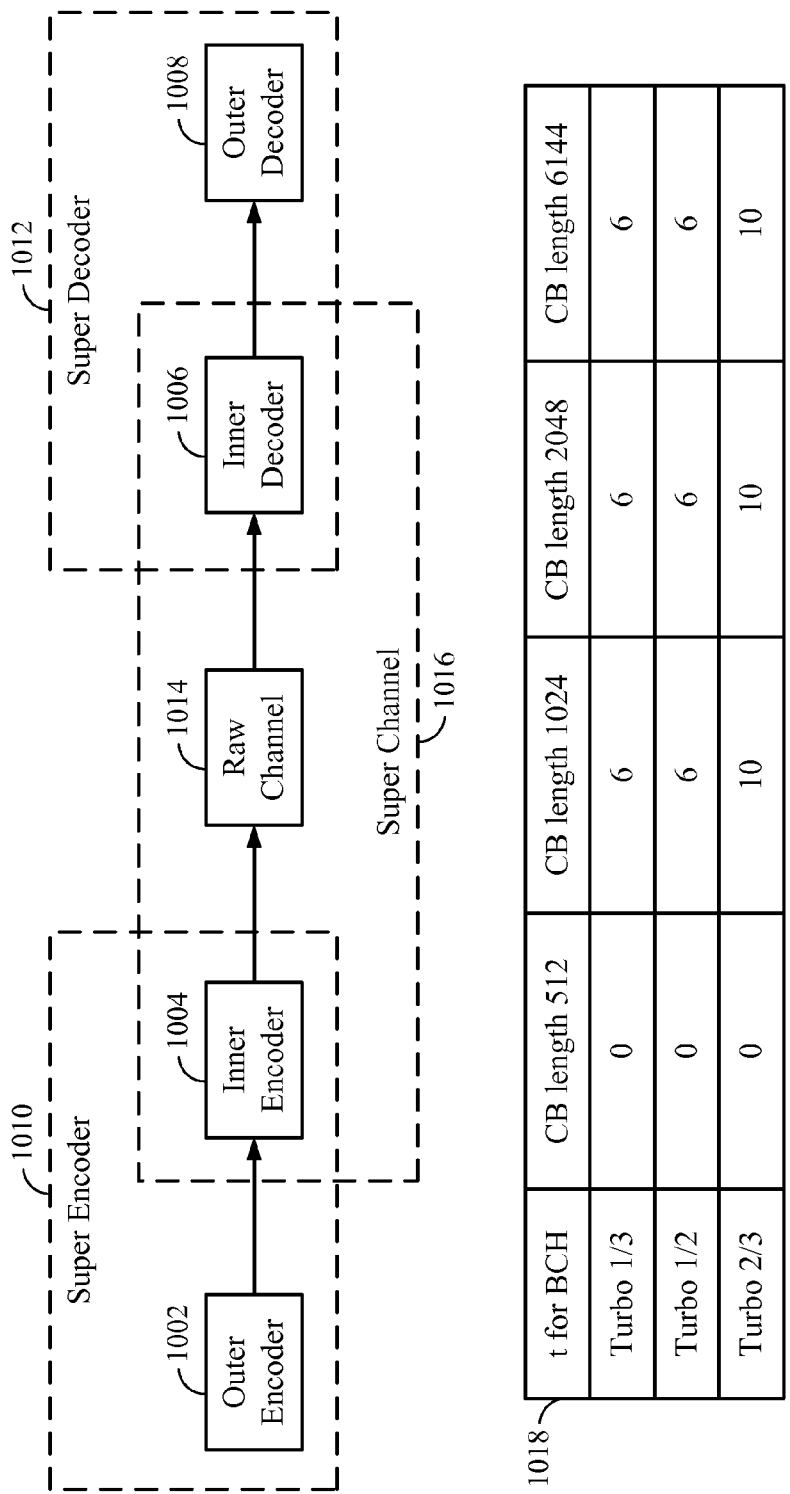
FIG. 10 illustrates one example of a concatenated coding scheme used by the user terminal or the gateway of FIG. 1.

FIG. 10 illustrates a concatenated coding scheme that may be used by a user terminal or a gateway. In the example of FIG. 10, the outer encoder 1002 encodes information bits according to a BCH code, where the inner encoder 1004 encodes the output of the outer encoder 1002 according to a turbo code (which may be termed the inner turbo code). The inner decoder 1006 decodes the received bits according to the turbo code implemented by the inner encoder 1004, and the outer decoder 1008 decodes the output of the inner decoder 1006 according to the BCH code implemented by the outer encoder 1002. The outer encoder 1002 and the inner encoder 1004 may be viewed as the super encoder 1010, and the inner decoder 1006 and the outer decoder 1008 may be viewed as the super decoder 1012. The inner encoder 1004 and the inner decoder 1006 when grouped with the raw channel 1014 as seen by the inner encoder 1004 and the inner decoder 1006 may be viewed as the super channel 1016.

The table 1018 provides t, the error correcting capability, of the outer BCH code as a function of code block length (CB) in bits and the code rate of the inner turbo code. For example, for a target BLER on the order of $10^{-6}$, an outer BCH is not used for a code block length less than or equal to 512 bits. For larger code block lengths, such as 1024, 2048, and 6144 bits, a t=6 outer BCH code is used with turbo codes rates of ½ and ⅓, and a t=10 outer BCH code is used with a turbo codes rate of ⅔. However, using an outer code lowers the error floor at the expense of degraded performance in the waterfall region of the BLER curves.

Figure 11:
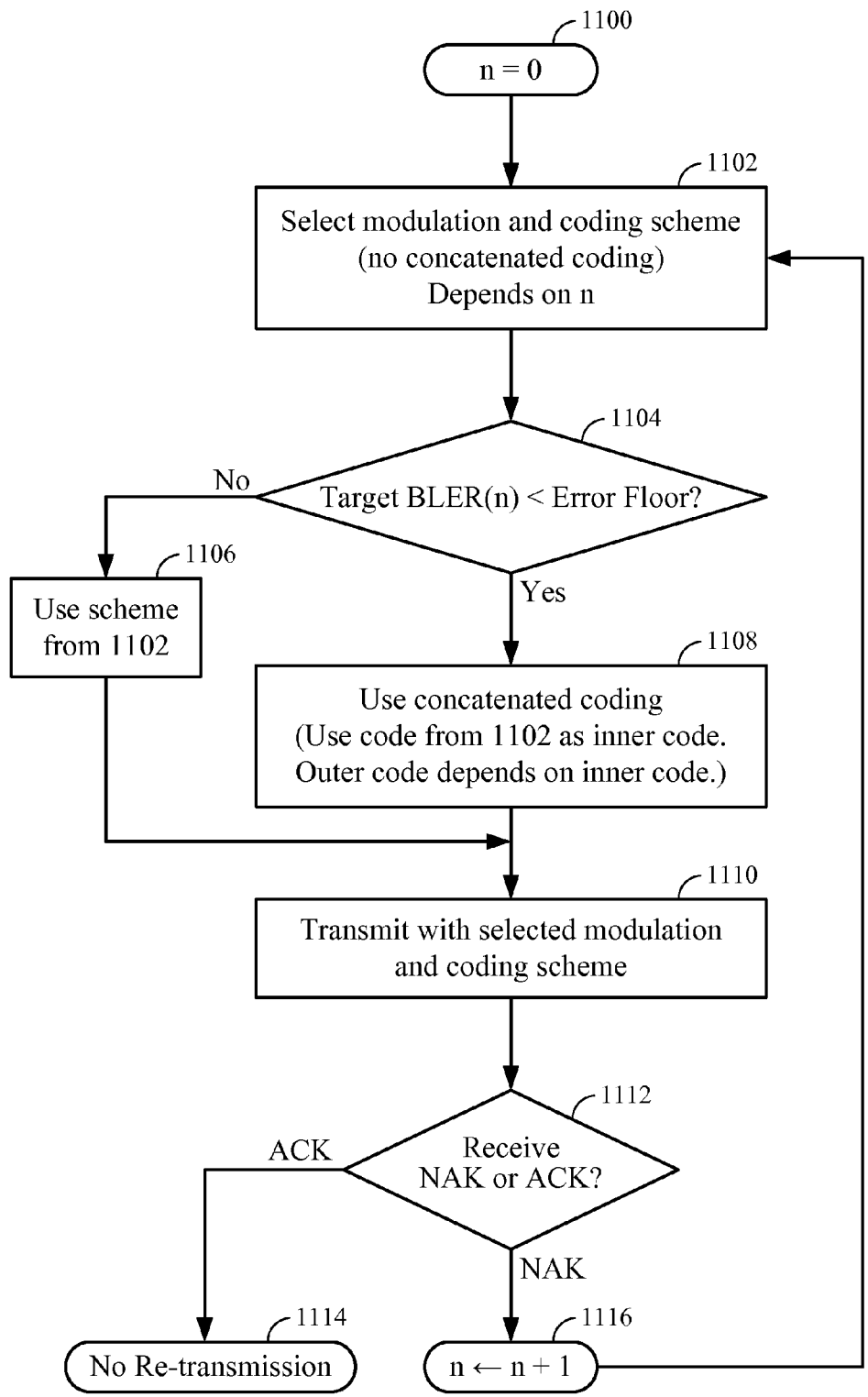
FIG. 11 illustrates one example of an adaptive ARQ scheme used by the user terminal or the gateway of FIG. 1.

FIG. 11 illustrates an ARQ (Automatic Repeat reQuest, or Automatic Repeat Query) method. A gateway as well as a UT may implement the method illustrated in FIG. 11, but for the case of a UT there is no mixing of multiple blocks from multiple UTs within a slot. For a gateway, the flexible communication structure illustrated in FIG. 7A allows that the ARQ re-transmissions occur with lower spectral efficiency and without re-segmentation. FIG. 11 illustrates actions by which a communication system may implement an adaptive ARQ approach where a first transmission of a block is spectrally more efficient than a re-transmission of the block. The actions listed in FIG. 11 pertain to a particular block, where the index n (not the same index n shown in FIG. 7A) refers to the number of re-transmissions for that block. The index n is initialized to 0 as indicated in the action 1100.

In the action 1102, a modulation and coding scheme is selected. This selection may be based upon the index n. For example, the modulation selected when n=1 may be a lower order modulation than that selected when n=0. However, the selection in the action 1102 does not include concatenated coding, so there is no outer code.

A decision is made in the action 1104 as to whether the target BLER is less than the error floor. The target BLER in the action 1104 is shown as indexed by n to indicate that the particular value chosen for the target BLER may depend upon the value of the index n. For example, when n=0, a value of $10^{-3}$ may be chosen, whereas if n>0 (denoting a re-transmission) the value of the target BLER may be chosen to be $10^{-6}$. However, it is to be appreciated that these are merely examples. The value of the error floor used in the action 1104 is for the particular modulation and coding scheme selected in the action 1102.

If the value of the target BLER is equal to or greater than the error floor, then control is brought to the action 1106, so that the modulation and coding scheme selected in the action 1102 is the scheme that will be used. Otherwise, control is brought to the action 1108 in which concatenated coding is enabled so that an outer code is used. As indicated in the parenthetical remarks in the action 1108, the particular outer code selected may depend upon the code that was selected in the action 1102. For example, the code rate of the outer code may depend upon the code selected in the action 1102. Because concatenated coding is enabled, the code that was selected in the action 1102 may now be referred to as an inner code.

As indicated in the action 1110, the block is transmitted with the modulation and coding scheme as determined by the previous actions. As indicated in the action 1112, if an ACK (acknowledgement) is received, then in the action 1114 no re-transmission is necessary. If a NAK (negative acknowledgement) is received, then in the action 1116 the index n is incremented by one and control is brought back to the action 1102, and the process repeats again for that particular block for re-transmission in another slot.

Figure 12:
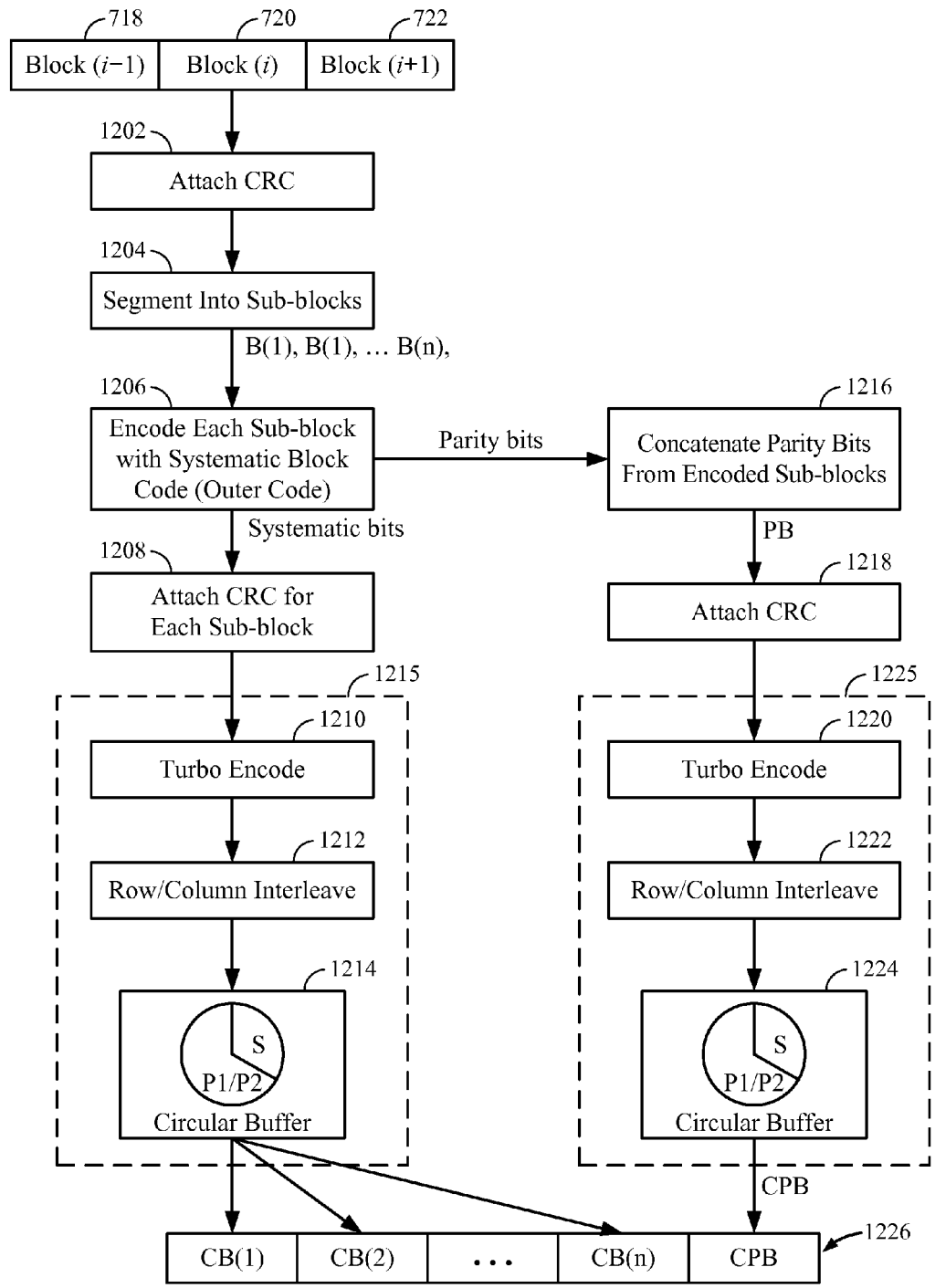
FIG. 12 illustrates a concatenated encoding scheme with inner turbo code and outer systematic block code.

FIG. 12 illustrates an example of concatenated encoding with an inner turbo code and an outer systematic block code. Each block of data (for example, blocks 718, 720, and 722 as illustrated in FIG. 7 and FIG. 12) is segmented into sub-blocks that are encoded using a systematic block encoder for the outer encoding and a turbo encoder for the inner encoding.

Referring to FIG. 12, the block 720 is provided to the concatenated encoding scheme. In the action 1202, a CRC (Cyclic Redundancy Check) is calculated for the block 720 and appended to that block. The appended bits need not necessarily be a CRC, so that other types of check bits may be calculated, but because the algebraic structure of a CRC lends itself to efficient computation it is commonly used in error correction. As will be described in FIG. 13, the CRC calculated in the action 1202 is used to declare whether the block 720 when received by a UT has been correctly decoded.

In the action 1204, the block 720 with its appended CRC is segmented into sub-blocks, indicated as B(1), B(2), ..., B(n). Segmentation is performed to match the computational requirements of turbo decoding to the available hardware, so that turbo encoding and turbo decoding is performed on a sub-block by sub-block basis.

In the action 1206, each sub-block is encoded using a systematic block encoder to implement the outer encoding scheme, such as the outer coder illustrated in FIG. 10. A BCH coding scheme is one particular example of a block encoder for the action 1206, although other codes, such as a Reed Solomon code, may be utilized. The systematic block encoder in the action 1206 need not be cyclic in its algebraic structure.

Because the encoding scheme in the action 1206 is systematic, the original sub-blocks are available to the action 1208. The action 1208, for each sub-block, calculates a CRC and appends it to the sub-block. The UT receiving a particular sub-block uses the received CRC for that sub-block to determine when to stop the iterations of the turbo decoder. The action 1208 is not a requirement.

In the action 1210, each sub-block with its attached CRC is turbo encoded. The turbo encoder in the action 1210 provides a stream of systematic bits and parity bits to the circular buffer 1214. The rate of the turbo encoder in the action 1210 may be ⅓ so that two parity bits are provided for each systematic bit, although other turbo encoders may be utilized. In the particular example of FIG. 12, the action 1212 applies a row and column interleave to the output of the turbo encoder.

The circular buffer 1214 is sampled to provide the appropriate code rate needed for the modulation symbol mapper 806 of FIG. 8. The sampling may include puncturing so that not all of the parity bits provided by the turbo encoder are transmitted, or the circular buffer 1214 may be oversampled in the sense that some of the systematic bits and parity bits are repeated in a transmission. The functional units indicated by the actions 1210, 1212, and 1214 may be grouped together, where the grouping may also be referred to as a turbo encoder, as indicated by the dashed box 1215. The output of the circular buffer 1214 (or the turbo encoder 1215) in response to a block of data, such as the block 720 in the slot 706 of FIG. 7, may be referred to as a coded sub-block. Each such coded sub-block is obtained by applying turbo encoding to a sub-block with its appended CRC, where a sub-block is a subset of a block, such as the block 720.

For example, the coded sub-block for the sub-block B(k) may be represented in the data structure 1226 by CB(k) for an arbitrary index k, so that for the sub-blocks B(1), B(2), ..., B(n) provided by the segmentation in the action 1204, the turbo encoder 1215 provides the coded sub-blocks CB(1), CB(2), ..., CB(n).

The action 1216 concatenates the parity bits provided from the systematic block encoder of the action 1206, where the parity block PB represents the concatenation (or grouping) of these parity bits. The parity block PB may then be treated in the same way as the systematic bits provided by the systematic block encoder of the action 1206. However, some implementations could segment the parity block PB, depending upon the computational power of the turbo decoder of the intended UT, but for ease of illustration the implementation represented by FIG. 12 does not segment the parity block PB into smaller parity blocks.

The action 1218 calculates the CRC for the parity block PB and appends it to the parity block PB, although in some implementations the action 1218 could be optional. The actions 1220, 1222, and the circular buffer in the action 1224 are essentially equivalent to their counterparts 1210, 1212, and 1214, so that the overall functionality represented in the actions 1220, 1222, and 1224 may be grouped together and considered as the turbo encoder 1225, although the particular turbo code for the turbo encoder 1225 may not be the same as the turbo code for the turbo encoder 1215. The output of the circular buffer 1224 (the output of the turbo encoder 1225) may be referred to as a coded parity block CPB.

The coded sub-blocks from the turbo encoder 1215 and the coded parity block CPB from the turbo encoder 1225 are concatenated and transmitted as the data structure 1226. The concatenation of the coded sub-blocks CB(1), CB(2), ..., CB(n) into the data structure 1226 would be the same as if the outer encoder in the action 1206 were absent. Accordingly, the signal processing structures to encode and decode a turbo code without an outer code may be used in the concatenated coding scheme of FIG. 12.

Figure 13:
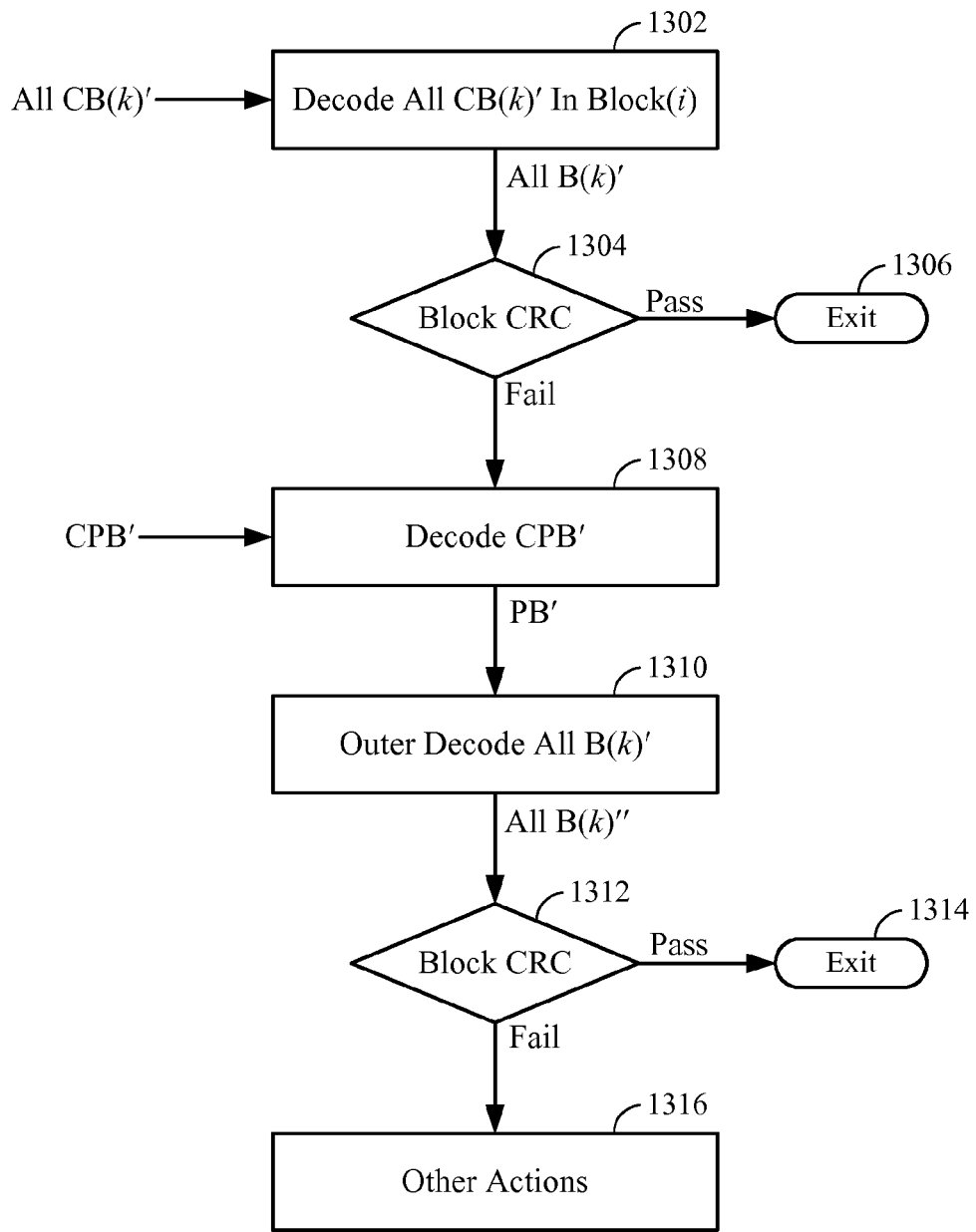
FIG. 13 illustrates decoding for the concatenated encoding scheme of FIG. 12.

FIG. 13 illustrates decoding for the concatenated encoding scheme of FIG. 12. In the action 1302, each received coded sub-block CB(k)', k=1, 2, ..., n, received in response to the transmission of an arbitrary block according to the data structure 1226 in FIG. 12, referred to as block(i) in FIG. 13, is decoded with a turbo decoder. The prime in CB(k)' distinguishes a received coded sub-block from the transmitted coded sub-block CB(k). The turbo decoder in a UT uses the received CRC in each received coded sub-block CB(k)' to determine when to stop the iterative procedure inherent in turbo decoding. In FIG. 13, the output of the turbo decoder in the action 1302 are all the sub-blocks B(k)' associated with block(i), where the index k runs from 1 to n and the prime denotes that B(k)' is an estimate of the transmitted sub-block B(k). If all errors (if any) have been corrected, then B(k)'=B(k).

In the action 1304, the sub-blocks B(k)' are concatenated together to provide an estimate of the transmitted block and block CRC. That is, concatenating the sub-blocks B(k)' provides an estimate of the transmitted block, for example the block 720 of FIG. 12, block(i)), and an estimate of the block CRC that was attached to the transmitted block in the action 1202 of FIG. 12. If in the action 1304 the estimated block CRC passes, then the estimate of the transmitted block is declared to be the transmitted block and the signal processing flow diagram of FIG. 13 may be exited as indicated by the action 1306.

Note that up to and including the action 1304, outer decoding has not yet been employed, so that if the estimated block CRC passes in the action 1304, then the received coded parity block CPB' is not needed.

If the estimated block CRC fails in the action 1304, then the action 1308 turbo decodes the received coded parity block CPB', where the prime in CPB' is used to distinguish a received coded parity block from the transmitted coded parity block CPB. The output of the turbo decoder in the action 1308 is denoted as PB', an estimate of the parity block PB obtained in the actions 1206 and 1216. Although the actions 1308 and 1302 are indicated as separate actions in the signal processing diagram of FIG. 13, in practice the same signal processing structure may be used for both actions. As in the action 1302, the turbo decoder in the action 1308 uses the received CRC in the received coded parity block CPB' to determine when to stop its iterative procedure. If all errors (if any) are corrected, then PB'=PB.

In the action 1310, an outer decoder uses the PB' to decode B(k)', k=1, 2, . . . , n, the output of the turbo decoder in the action 1302. For example, the outer decoder finds a codeword with the smallest Hamming distance from the word [B(1)'|B(2)'| . . . |B(n)'|PB'] to provide the outer decoded sub-blocks B(k)", k=1, 2, . . . , n, where the double prime denotes that inner turbo decoding and outer decoding have been applied to the received coded sub-blocks CB(k)'.

In the action 1312, the B(k)", k=1, 2, . . . , n are concatenated to form a second estimate of the transmitted block with block CRC, and the (second) estimated block CRC is checked. The signal processing structure for the action 1304 may be used for the action 1312. As in the action 1304, if the (second) estimated block CRC passes, then it is assumed that the received block has been correctly decoded and is available to higher layers in the protocol stack, as indicated by the action 1314.

If in the action 1312 the (second) estimated block CRC fails, then as indicated in box 1316 other actions may be taken. For example, the UT may send a NAK message so that the gateway may transmit the data structure 1226 again, or the received data may be dropped.

If the parity bits obtained by the systematic encoder of the action 1206 for a set of sub-blocks of a block are grouped into multiple parity blocks, then the action 1218 is repeated so that a CRC is calculated and appended to each parity block, followed by turbo encoding of each parity block with appended CRC. The data structure 1226 would then include multiple coded parity blocks. With multiple coded parity blocks received at a UT, the action 1308 is repeated for each received coded parity block associated with a received block (i.e., received data structure 1226). The decoded parity blocks are then used in the action 1310 for outer decoding.

The PHY 616 and MAC 618 layers of the signal processing system 600 of FIG. 6 may perform the signal processing actions indicated in FIGS. 12 and 13, where for the actions of FIG. 12 the signal processing system 600 is in a gateway, such as for example the gateway 200 in FIG. 1, and for the actions of FIG. 13 the signal processing system 600 is in a UT, such for example the UT 400 in FIG. 1 (or any of the other user terminals).

Figure 14:
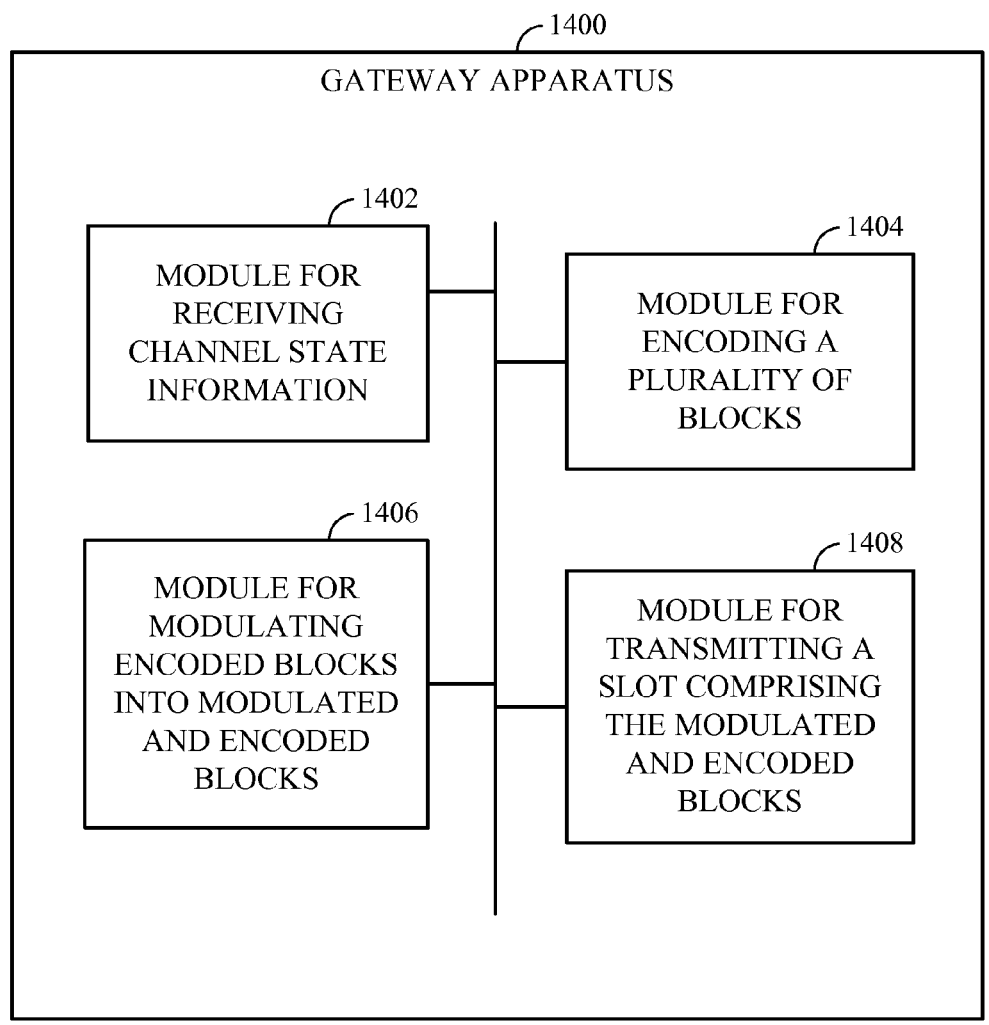
FIG. 14 illustrates one example of a gateway with interrelated functional modules.

FIG. 14 illustrates an example gateway apparatus 1400 represented as a series of interrelated functional modules as discussed with respect to the examples of FIGS. 6-11. A module for receiving channel state information 1402 may correspond at least in some aspects to, for example, a signal processing system or a component thereof as discussed herein (e.g., the signal processing system 600 of FIG. 6 or the like). A module for encoding a plurality of blocks 1404 may correspond at least in some aspects to, for example, a signal processing system or a component thereof as discussed herein (e.g., the signal processing system 600 of FIG. 6 or the like). A module for modulating encoded blocks into modulated and encoded blocks 1406 may correspond at least in some aspects to, for example, a signal processing system or a component thereof as discussed herein (e.g., the signal processing system 600 of FIG. 6 or the like). A module for transmitting a slot comprising the modulated and encoded blocks 1408 may correspond at least in some aspects to, for example, a signal processing system or a component thereof as discussed herein (e.g., the signal processing system 600 of FIG. 6 or the like).

Figure 15:
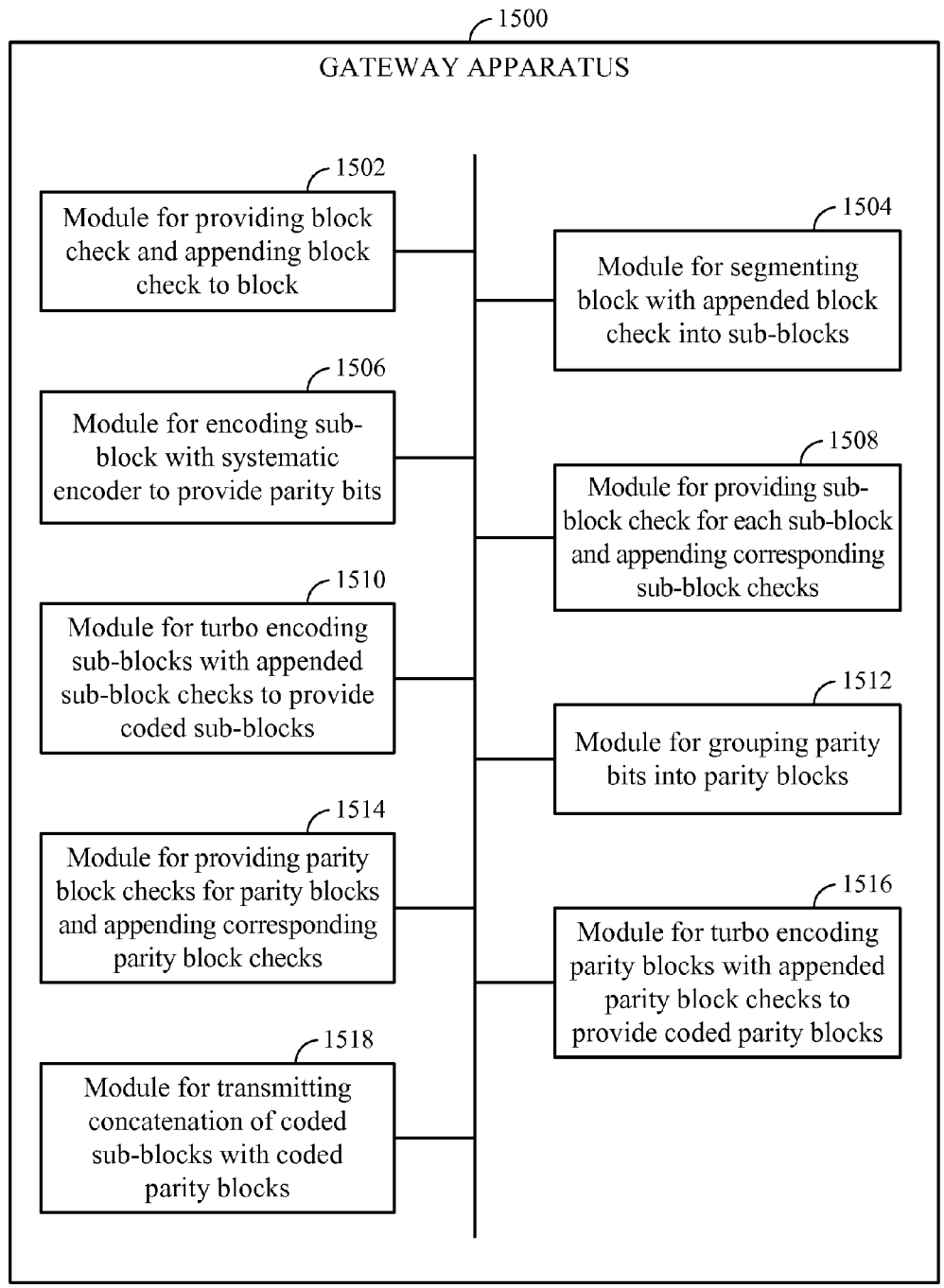
FIG. 15 illustrates one example of a gateway with interrelated functional modules.

FIG. 15 illustrates another example gateway apparatus 1500 represented as a series of interrelated functional modules as discussed with respect to the examples of FIG. 12 and FIG. 13. A module for providing a block check and appending a block check to the block 1502 may correspond at least in some aspects to, for example, a signal processing system or a component thereof as discussed herein (e.g., the signal processing system 600 of FIG. 6 or the like). A module for segmenting a block with an appended block check into one or more sub-blocks 1504 may correspond at least in some aspects to, for example, a signal processing system or a component thereof as discussed herein (e.g., the signal processing system 600 of FIG. 6 or the like). A module for encoding a sub-block with a systematic encoder to provide parity bits 1506 may correspond at least in some aspects to, for example, a signal processing system or a component thereof as discussed herein (e.g., the signal processing system 600 of FIG. 6 or the like). A module for providing a sub-block check for each sub-block and appending the corresponding sub-block checks 1508 may correspond at least in some aspects to, for example, a signal processing system or a component thereof as discussed herein (e.g., the signal processing system 600 of FIG. 6 or the like). A module for turbo encoding sub-blocks with appended sub-block checks to provide coded sub-blocks 1510 may correspond at least in some aspects to, for example, a signal processing system or a component thereof as discussed herein (e.g., the signal processing system 600 of FIG. 6 or the like). A module for grouping parity bits into parity blocks 1512 may correspond at least in some aspects to, for example, a signal processing system or a component thereof as discussed herein (e.g., the signal processing system 600 of FIG. 6 or the like). A module for providing parity block checks for parity blocks and appending the corresponding parity block checks 1514 may correspond at least in some aspects to, for example, a signal processing system or a component thereof as discussed herein (e.g., the signal processing system 600 of FIG. 6 or the like). A module for turbo encoding the parity blocks with appended parity block checks to provide coded parity blocks 1516 may correspond at least in some aspects to, for example, a signal processing system or a component thereof as discussed herein (e.g., the signal processing system 600 of FIG. 6 or the like). A module for transmitting the concatenation of coded sub-blocks with coded parity blocks 1518 may correspond at least in some aspects to, for example, a signal processing system or a component thereof as discussed herein (e.g., the signal processing system 600 of FIG. 6 or the like).

Figure 16:
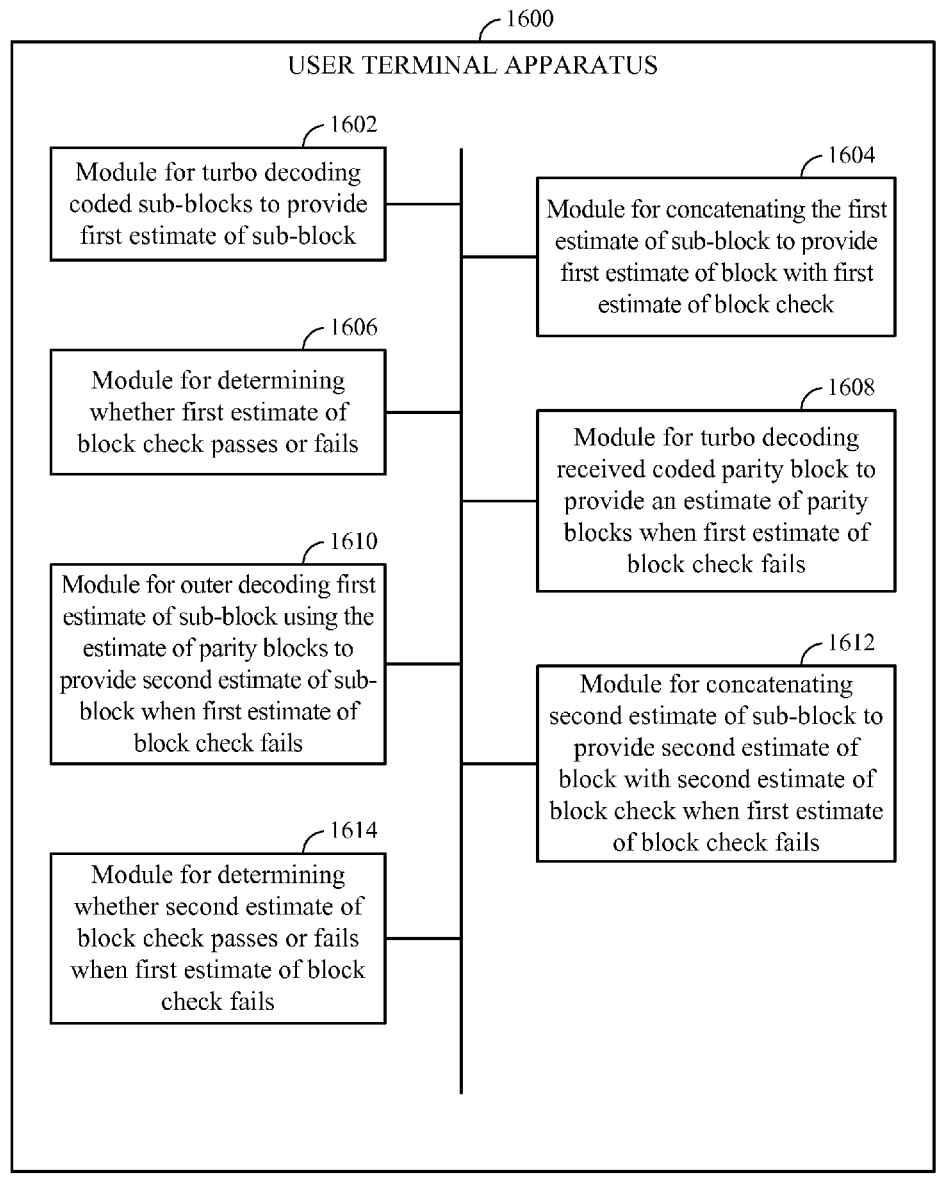
FIG. 16 illustrates one example of a user terminal with interrelated functional modules.

FIG. 16 illustrates an example user terminal apparatus 1600 represented as a series of interrelated functional modules as discussed with respect to the examples of FIG. 12 and FIG. 13. A module for turbo decoding coded sub-blocks to provide a first estimate of a sub-block 1602 may correspond at least in some aspects to, for example, a signal processing system or a component thereof as discussed herein (e.g., the signal processing system 600 of FIG. 6 or the like). A module for concatenating the first estimate of a sub-block to provide a first estimate of a block with a first estimate of a block check 1604 may correspond at least in some aspects to, for example, a signal processing system or a component thereof as discussed herein (e.g., the signal processing system 600 of FIG. 6 or the like). A module for determining whether the first estimate of a block check passes or fails 1606 may correspond at least in some aspects to, for example, a signal processing system or a component thereof as discussed herein (e.g., the signal processing system 600 of FIG. 6 or the like). A module for turbo decoding a received coded parity block to provide an estimate of parity blocks when the first estimate of the block check fails 1608 may correspond at least in some aspects to, for example, a signal processing system or a component thereof as discussed herein (e.g., the signal processing system 600 of FIG. 6 or the like). A module for outer decoding the first estimate of a sub-block using the estimate of parity blocks to provide a second estimate of the sub-block when the first estimate of the block check fails 1610 may correspond at least in some aspects to, for example, a signal processing system or a component thereof as discussed herein (e.g., the signal processing system 600 of FIG. 6 or the like). A module for concatenating the second estimate of a sub-block to provide a second estimate of the block with a second estimate of the block check when the first estimate of the block check fails 1612 may correspond at least in some aspects to, for example, a signal processing system or a component thereof as discussed herein (e.g., the signal processing system 600 of FIG. 6 or the like). A module for determining whether the second estimate of a block check passes or fails when the first estimate of the block check fails 1614 may correspond at least in some aspects to, for example, a signal processing system or a component thereof as discussed herein (e.g., the signal processing system 600 of FIG. 6 or the like).

The functionality of the modules of FIGS. 14, 15, and 16 may be implemented in various ways consistent with the teachings herein. In some designs, the functionality of these modules may be implemented as one or more electrical components. In some designs, the functionality of these blocks may be implemented as a processing system including one or more processor components. In some designs, the functionality of these modules may be implemented using, for example, at least a portion of one or more integrated circuits (e.g., an ASIC). As discussed herein, an integrated circuit may include a processor, software, other related components, or some combination thereof. Thus, the functionality of different modules may be implemented, for example, as different subsets of an integrated circuit, as different subsets of a set of software modules, or a combination thereof. Also, it will be appreciated that a given subset (e.g., of an integrated circuit and/or of a set of software modules) may provide at least a portion of the functionality for more than one module.

In addition, the components and functions represented by FIGS. 14, 15, and 16 as well as other components and functions described herein, may be implemented using any suitable means. Such means also may be implemented, at least in part, using corresponding structure as taught herein. For example, the components described above in conjunction with the "module for" components of FIGS. 14, 15, and 16 also may correspond to similarly designated "means for" functionality. Thus, in some aspects one or more of such means may be implemented using one or more of processor components, integrated circuits, or other suitable structure as taught herein.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, aspects of the claimed subject matter may include a non-transitory computer-readable media embodying a method for spectral efficient data transmission in satellite systems. Accordingly, the claimed subject matter is not limited to illustrated examples.

While the foregoing disclosure shows illustrative aspects of the claimed subject matter, it should be noted that various changes and modifications could be made herein without departing from the scope of the invention as defined by the appended claims. The functions, steps and/or actions of the method claims in accordance with the description herein need not be performed in any particular order. Furthermore, although aspects of the claimed subject matter may be described or claimed in the singular, the plural is contemplated unless limitation to the singular is explicitly stated.

What is claimed is:

1. A method comprising:
   demodulating, at a gateway, channel state information from a plurality of user terminals via a satellite;
   encoding by the gateway a plurality of blocks into a plurality of encoded blocks, each block for a corresponding user terminal, wherein the gateway encodes each block according to the value of the channel state information of its corresponding user terminal;
   modulating by the gateway the plurality of encoded blocks into a plurality of modulated and encoded blocks, wherein the gateway modulates each encoded block according to the value of the channel state information of its corresponding user terminal; and
   transmitting by the gateway to the plurality of user terminals via the satellite a slot comprising the plurality of modulated and encoded blocks.

2. The method of claim 1,
   wherein the encoding by the gateway comprises a first encoding of a block into a first encoded block according to the value of the channel state information of its corresponding user terminal; and
   wherein the modulating by the gateway comprises a first modulating of the first encoded block into a first modulated and encoded block according to the value of the channel state information of its corresponding user terminal;

the method further comprising:
receiving a negative acknowledgement for the first modulated and encoded block;
a second encoding by the gateway of the block into a second encoded block;
a second modulating by the gateway of the second encoded block into a second modulated and encoded block; and
transmitting by the gateway a second slot comprising the second modulated and encoded block.

3. The method of claim 2, wherein the second encoding provides greater error correction than the first encoding.

4. The method of claim 3, wherein the second modulating has a lower order than the first modulating.

5. The method of claim 3, wherein the first modulating and the second modulating are the same modulating scheme.

6. The method of claim 3, wherein the first encoding does not include an outer code.

7. The method of claim 6, wherein the second encoding includes concatenated encoding.

8. The method of claim 2, wherein the second modulating has a lower order than the first modulating.

9. The method of claim 8, wherein the first encoding and the second encoding are the same encoding scheme.

10. The method of claim 1, the slot comprising a pilot for synchronization of the plurality of user terminals.

11. The method of claim 1, wherein the encoding by the gateway comprises:
selecting a first modulation and coding scheme with no concatenated coding, the first modulation and coding scheme having an error floor; and
encoding and modulating a block according to the first modulation and coding scheme if a target block error rate for the block and the error floor satisfy a relationship, otherwise if the target block error rate for the block and the error floor do not satisfy the relationship then encoding and modulating the block according to a second modulation and coding scheme where the second modulation and coding scheme includes an outer code.

12. The method of claim 11, wherein the relationship is the less than inequality.

13. The method of claim 11, wherein the second modulation and coding scheme includes an inner turbo code and an outer BCH code.

14. A gateway comprising:
a modem; and
at least one processor in communication with the modem, the at least one processor and the modem configured, in combination, to:
demodulate channel state information from a plurality of user terminals via a satellite;
encode a plurality of blocks into a plurality of encoded blocks, each block for a corresponding user terminal, wherein each block is encoded according to the value of the channel state information of its corresponding user terminal;
modulate the plurality of encoded blocks into a plurality of modulated and encoded blocks, wherein each encoded block is modulated according to the value of the channel state information of its corresponding user terminal; and
cause the gateway to transmit the plurality of user terminals via the satellite a slot comprising the plurality of modulated and encoded blocks.

15. The gateway of claim 14, wherein the at least one processor and the modem are further configured, in combination, to:
encode a block into a first encoded block according to the value of the channel state information of its corresponding user terminal;
modulate the first encoded block into a first modulated and encoded block according to the value of the channel state information of its corresponding user terminal; and
in response to the gateway receiving a negative acknowledgement for the first modulated and encoded block, encode the block into a second encoded block, modulate the second encoded block into a second modulated and encoded block, and cause the gateway to transmit a second slot comprising the second modulated and encoded block.

16. The gateway of claim 15, wherein the second encoded block has greater error correction than the first encoded block.

17. The gateway of claim 16, wherein the second modulated and encoded block has a lower order modulation than the first modulated and encoded block.

18. The gateway of claim 16, wherein the at least one processor and the modem are further configured, in combination, to modulate the first encoded block and the second encoded block according to the same modulation scheme.

19. The gateway of claim 16, wherein the at least one processor and the modem are further configured, in combination, to encode the block into the first encoded block without concatenating encoding.

20. The gateway of claim 19, wherein the at least one processor and the modem are further configured, in combination, to encode the block into the second encoded block with concatenated encoding.

21. The gateway of claim 15, wherein the second modulated and encoded block has a lower order modulation than the first modulated and encoded block.

22. The gateway of claim 21, wherein the at least one processor and the modem are further configured, in combination, to encode the block into the first encoded block and encode the block into the second encoded block according to the same encoding scheme.

23. The gateway of claim 14, the slot comprising a pilot for synchronization of the plurality of user terminals.

24. The gateway of claim 14, wherein the at least one processor and the modem are further configured, in combination, to
select a first modulation and coding scheme with no concatenated coding, where the first modulation and coding scheme has an error floor; and
encode and modulate a block according to the first modulation and coding scheme if a target block error rate for the block and the error floor satisfy a relationship, otherwise if the target block error rate for the block and the error floor do not satisfy the relationship, then encode and modulate the block according to a second modulation and coding scheme where the second modulation and coding scheme includes an outer code.

25. The gateway of claim 24, wherein the relationship is the less than inequality.

26. The gateway of claim 24, wherein the second modulation and coding scheme comprises an inner turbo code and an outer BCH code.

27. A non-transitory computer-readable media having stored instructions that, when executed by at least one processor in a gateway, cause the gateway to perform a method comprising:
- demodulating channel state information from a plurality of user terminals via a satellite;
- encoding a plurality of blocks into a plurality of encoded blocks, each block for a corresponding user terminal, wherein each block is encoded according to the value of the channel state information of its corresponding user terminal;
- modulating the plurality of encoded blocks into a plurality of modulated and encoded blocks, wherein each encoded block is modulated according to the value of the channel state information of its corresponding user terminal; and
- transmitting to the plurality of user terminals via the satellite a slot comprising the plurality of modulated and encoded blocks.

28. The non-transitory computer-readable media of claim 27,
- wherein the encoding in the method comprises a first encoding of a block into a first encoded block according to the value of the channel state information of its corresponding user terminal; and
- wherein the modulating in the method comprises a first modulating of the first encoded block into a first modulated and encoded block according to the value of the channel state information of its corresponding user terminal;
- the method further comprising:
  - receiving a negative acknowledgement for the first modulated and encoded block;
  - a second encoding of the block into a second encoded block;
  - a second modulating of the second encoded block into a second modulated and encoded block; and
  - transmitting a second slot comprising the second modulated and encoded block.

29. The non-transitory computer-readable media of claim 28, wherein the second encoding provides greater error correction than the first encoding.

30. The non-transitory computer-readable media of claim 29, wherein the second modulating has a lower order than the first modulating.

31. The non-transitory computer-readable media of claim 29, wherein the first modulating and the second modulating are the same modulating scheme.

32. The non-transitory computer-readable media of claim 29, wherein the first encoding does not include an outer code.

33. The non-transitory computer-readable media of claim 32, wherein the second encoding includes concatenated encoding.

34. The non-transitory computer-readable media of claim 28, wherein the second modulating has a lower order than the first modulating.

35. The non-transitory computer-readable media of claim 34, wherein the first encoding and the second encoding are the same encoding scheme.

36. The non-transitory computer-readable media of claim 27, the slot comprising a pilot for synchronization of the plurality of user terminals.

37. The non-transitory computer-readable media of claim 27, wherein the encoding in the method comprises:
- selecting a first modulation and coding scheme with no concatenated coding, the first modulation and coding scheme having an error floor; and
- encoding and modulating a block according to the first modulation and coding scheme if a target block error rate for the block and the error floor satisfy a relationship, otherwise if the target block error rate for the block and the error floor do not satisfy the relationship, then encoding and modulating the block according to a second modulation and coding scheme where the second modulation and coding scheme includes an outer code.

38. The non-transitory computer-readable media of claim 37, wherein the relationship is the less than inequality.

39. The non-transitory computer-readable media of claim 37, wherein the second modulation and coding scheme includes an inner turbo code and an outer BCH code.

40. A gateway comprising:
- means for demodulating, at the gateway, channel state information from a plurality of user terminals via a satellite;
- means for encoding by the gateway a plurality of blocks into a plurality of encoded blocks, each block for a corresponding user terminal, wherein the gateway encodes each block according to the value of the channel state information of its corresponding user terminal;
- means for modulating by the gateway the plurality of encoded blocks into a plurality of modulated and encoded blocks, wherein the gateway modulates each encoded block according to the value of the channel state information of its corresponding user terminal; and
- means for transmitting by the gateway to the plurality of user terminals via the satellite a slot comprising the plurality of modulated and encoded blocks.

41. The gateway of claim 40,
- wherein the means for encoding by the gateway comprises a first encoding of a block into a first encoded block according to the value of the channel state information of its corresponding user terminal;
- wherein the means for modulating by the gateway comprises a first modulating of the first encoded block into a first modulated and encoded block according to the value of the channel state information of its corresponding user terminal; and
- wherein if the gateway receives a negative acknowledgement for the first modulated and encoded block, the means for encoding comprises a second encoding by the gateway of the block into a second encoded block, the means for modulating comprises a second modulating by the gateway of the second encoded block into a second modulated and encoded block, and the means for transmitting comprises the gateway transmitting a second slot comprising the second modulated and encoded block.

42. The gateway of claim 41, wherein the second encoding provides greater error correction than the first encoding.

43. The gateway of claim 42, wherein the second modulating has a lower order than the first modulating.

44. The gateway of claim 42, wherein the first modulating and the second modulating are the same modulating scheme.

45. The gateway of claim 42, wherein the first encoding does not include an outer code.

46. The gateway of claim 45, wherein the second encoding includes concatenated encoding.

47. The gateway of claim 41, wherein the second modulating has a lower order than the first modulating.

48. The gateway of claim 47, wherein the first encoding and the second encoding are the same encoding scheme.

49. The gateway of claim 40, the slot comprising a pilot for synchronization of the plurality of user terminals.

50. The gateway of claim 40, wherein the means for encoding by the gateway comprises:
- selecting a first modulation and coding scheme with no concatenated coding, the first modulation and coding scheme having an error floor; and
- encoding and modulating a block according to the first modulation and coding scheme if a target block error rate for the block and the error floor satisfy a relationship, otherwise if the target block error rate for the block and the error floor do not satisfy the relationship, then encoding and modulating the block according to a second modulation and coding scheme where the second modulation and coding scheme includes an outer code.

51. The gateway of claim 50, wherein the relationship is the less than inequality.

52. The gateway of claim 50, wherein the second modulation and coding scheme includes an inner turbo code and an outer BCH code.

* * * * *